US010686025B2

(12) United States Patent
Oh

(10) Patent No.: US 10,686,025 B2
(45) Date of Patent: Jun. 16, 2020

(54) ORGANIC LIGHT EMITTING DISPLAY DEVICE HAVING CONNECTION LINES PASSING THROUGH A BENDING REGION

(71) Applicant: Samsung Display Co., Ltd., Yongin-si, Gyeonggi-do (KR)

(72) Inventor: Sang-Hun Oh, Cheonan-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 15/293,997

(22) Filed: Oct. 14, 2016

(65) Prior Publication Data
US 2017/0125505 A1 May 4, 2017

(30) Foreign Application Priority Data

Oct. 30, 2015 (KR) .................... 10-2015-0151885

(51) Int. Cl.
*H01L 27/32* (2006.01)
*H01L 51/52* (2006.01)
*H01L 27/12* (2006.01)

(52) U.S. Cl.
CPC ...... *H01L 27/3276* (2013.01); *H01L 27/3262* (2013.01); *H01L 51/52* (2013.01); *H01L 27/1244* (2013.01); *H01L 27/1248* (2013.01); *H01L 27/3246* (2013.01); *H01L 27/3258* (2013.01); *H01L 2251/5338* (2013.01)

(58) Field of Classification Search
CPC ............. H01L 27/3276; H01L 27/3256; H01L 27/3258; H01L 27/124; H01L 27/1218; H01L 2251/5338

USPC ............. 257/40, 59, 72, 80, 99, 49; 313/505
See application file for complete search history.

(56) References Cited

U.S. PATENT DOCUMENTS

| 7,787,097 B2 | 8/2010 | Satoh |
| 2012/0138940 A1* | 6/2012 | Sato .................... H01L 27/1218 257/59 |
| 2012/0162053 A1* | 6/2012 | Lee ..................... H01L 27/3276 345/80 |
| 2013/0049062 A1* | 2/2013 | Hatano ................... H01L 21/50 257/99 |
| 2013/0169515 A1 | 7/2013 | Prushinskiy et al. |
| 2014/0183473 A1 | 7/2014 | Lee et al. |
| 2014/0353670 A1* | 12/2014 | Youn ..................... H01L 27/124 257/72 |

(Continued)

*Primary Examiner* — Robert T Huber
*Assistant Examiner* — Eric W Jones
(74) *Attorney, Agent, or Firm* — H.C. Park & Associates, PLC

(57) ABSTRACT

An organic light emitting display device that includes a substrate that may be flexible, and an insulation layer arranged on the substrate. The insulation layer is perforated by openings to facilitate bending of the display device. A plurality of the connection lines extend from the image producing display area to a peripheral area of the display device to allow for connection to an external device. Each of the openings includes one of the connection lines to prevent shorting together of the connection hues during the patterning step used to pattern the connection lines. In one embodiment, the each of the connection lines extends through the openings and across the sidewalls of the openings. In another embodiment, the connection lines are interposed between two adjacent openings.

3 Claims, 24 Drawing Sheets

(56) References Cited

U.S. PATENT DOCUMENTS

| | | | |
|---|---|---|---|
| 2014/0374703 A1* | 12/2014 | Jung | H01L 51/0031 257/40 |
| 2015/0076476 A1* | 3/2015 | Odaka | H01L 27/3258 257/40 |
| 2015/0349294 A1* | 12/2015 | Lee | H01L 51/5246 257/40 |
| 2016/0100483 A1* | 4/2016 | Hwang | H05B 33/06 313/505 |

* cited by examiner

FIG. 2
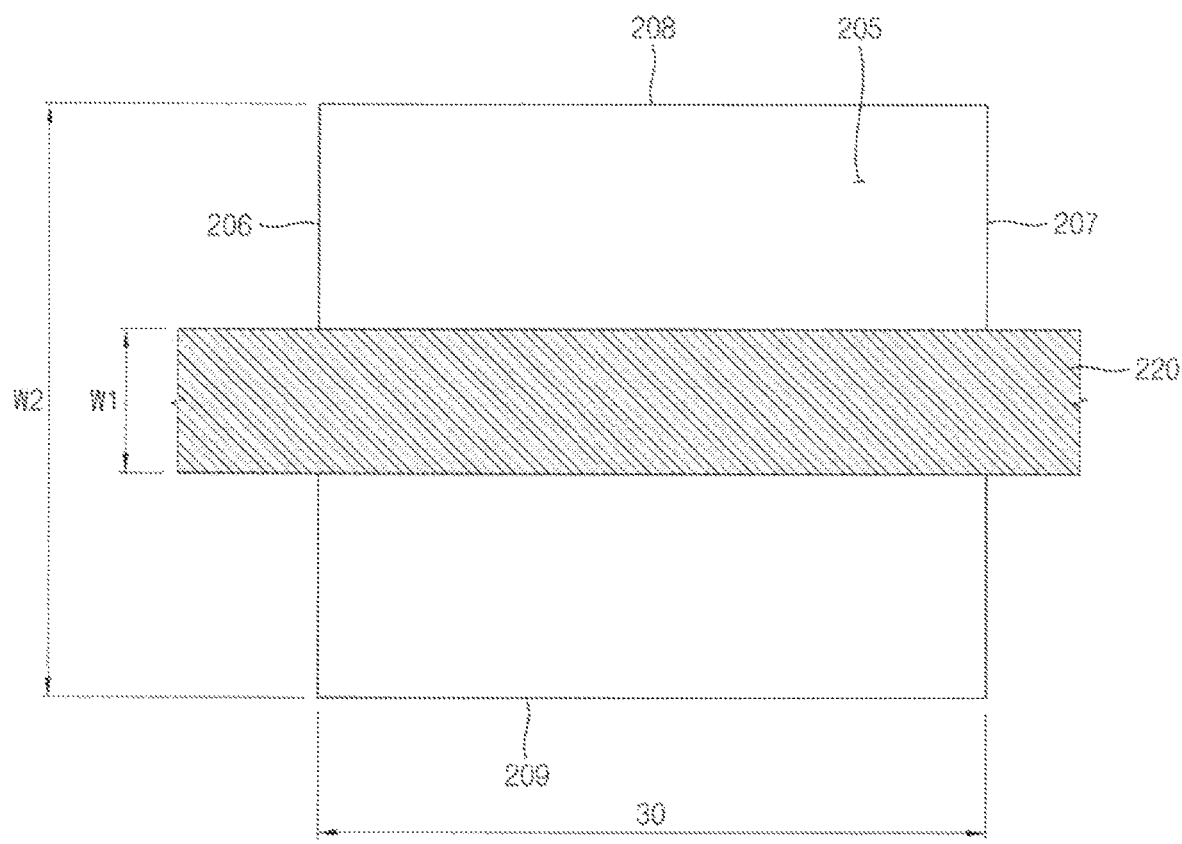
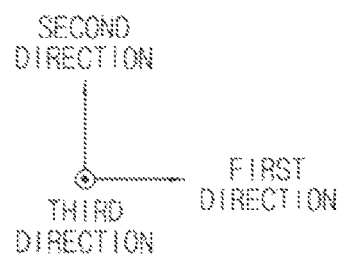

ORGANIC LIGHT EMITTING DISPLAY DEVICE HAVING CONNECTION LINES PASSING THROUGH A BENDING REGION

CLAIM OF PRIORITY

A claim for priority under 35 U.S.C. § 119 is made to Korean Patent Application No, 10-2015-0151885 filed Oct. 30, 2015 within the Korean Intellectual Property Office, the entire contents of which are hereby incorporated by reference.

BACKGROUND OF THE INVENTION

Field of the Invention

Example embodiments relate generally to an organic light emitting display device. More particularly, embodiments of the present inventive concept for a flexible organic light emitting display device where the connection lines are less apt to short together.

Description of the Related Art

A flat panel display (FPD) device is widely used as a display device of an electronic device because the FPD device is lightweight and thin compared to a cathode-ray tube (CRT) display device. Typical examples of the FPD device are a liquid crystal display (LCD) device and an organic light, emitting display (OLED) device. Compared to the LCD device, the OLED device has man advantages such as a higher luminance and a wider viewing angle. In addition, the OLED device can be made thinner because the OLED device does not require a backlight. Within the OLED device, electrons and holes are injected into an organic thin layer through a cathode and an anode, and then recombined within the organic thin layer to generate excitons thereby a light of a certain wavelength can be emitted.

Recently, a flexible OLED capable of bending or folding by including a flexible lower substrate and a thin film encapsulation substrate has been developed. On the other hand, a neutral plane may be controlled by removing an insulation layer in bending or folding regions of a pad region (e.g., a portion where the flexible OLED is electrically contacted with an external device) of the flexible OLED.

SUMMARY OF THE INVENTION

Some example embodiments provide an organic light emitting display device including an insulation layer having openings in a pad region.

According to one aspect of the present invention, there is provided an organic light emitting display (OLED) de ice including a substrate including a first region being spaced-apart from a second region by the third region, a plurality of pixel structures arranged within the first region and on the substrate, an insulation layer arranged on the substrate and within the first through third regions, the insulation layer being perforated by a plurality of openings arranged within the third region, the openings extend in the first direction and are spaced apart from one another in a second direction, the openings exposing the substrate, both of the first and second directions being parallel to an upper surface of the substrate and are perpendicular to one another and a plurality of connection lines extending in the first direction on the substrate, portions of the connection lines within the first and second regions being arranged on the insulation layer, wherein within the third region, the connection lines being arranged on at least a portion of side walls of the openings that are spaced-apart from one another in the first direction and on at least a portion of the substrate exposed by the openings, the connection lines electrically connecting the pixel structures to an external device.

The openings within the insulation layer may include first through (N)th openings, where N is an integer greater than 1, and the connection lines include first through (M)th connection lines, where M is an integer greater than 1, the insulation layer may be spatially separated by the openings within the third region, and wherein a (L)th connection line among the first through (M)th connection lines may be disposed on at least a portion of each of side walls that are located along the first direction of a (K)th opening among the first through (N)th openings and on at least a portion of the substrate exposed by the (K)th opening within the third region, where K may be an integer between 1 and N, and L may be an integer between 1 and M. A width in the second direction of each opening may be greater than a width in the second direction of each connection line. The OLED device may also include a planarization layer arranged on the connection lines, the planarization layer including to first via hole within the second region exposing one of the connection lines and a pad electrode arranged within the second region, the pad electrode may be in contact with the connection line through the first via hole of the planarization layer. The planarization layer may also include a second via hole exposing the connection line at a location that is adjacent to a boundary of the second and third regions. The OLED device may also include a protection member arranged on the planarization layer and within the third region. The planarization layer may include a third via hole that exposes the connection line at a location that is adjacent to a boundary of the first and third regions.

The OLED device may also include a first auxiliary line interposed between the protection member and the planarization layer, the first auxiliary line may be electrically connected to one of the connection lines through the third via hole and may be electrically connected to the one of the connection lines through the second via hole. The first auxiliary line may be integrally formed with the connection line.

The pixel structure may include a semiconductor element that includes an active layer arranged on the substrate, a gate electrode arranged on the active layer, and source and drain electrodes arranged on the gate electrode, the pixel structure may also include a first electrode arranged on the semiconductor element, a light emitting layer arranged on the first electrode and a second electrode arranged on the light emitting layer. The first electrode, the pad electrode, and the first auxiliary line may be simultaneously formed and may be made out of a same material, the source and drain electrodes and the connection lines may be simultaneously formed and are comprised of a same material. The OLED may also include a pixel defining layer arranged on the planarization layer, the pixel defining layer may cover both lateral portions of the first electrode and both lateral portions of the pad electrode. The pixel defining layer and the protection member may be simultaneously formed and may be made out of a same material. The insulation layer may include a gate insulation layer arranged on the active layer and an insulating interlayer arranged on the gate electrode arranged on the gate insulation layer.

The OLED may also include a second auxiliary line embedded within the substrate within each of the first, second and third regions. The insulation layer may also include a fourth via hole arranged within the second region and exposing the second auxiliary line by removing a portion of the substrate, a portion of gate insulation layer, and a portion of the insulating interlayer and a fifth via hole arranged within the first region and exposing the second auxiliary line by removing a portion of the substrate, a portion of gate insulation layer, and a portion of the insulating interlayer. One of the connection lines may be in contact with the second auxiliary line through the fourth via hole within the second region, and may be in contact with the second auxiliary line through the fifth is hole within the first region.

According to another aspect of the present invention, there is provided an organic light emitting display (OLED) device that includes a substrate including, a first region spaced apart from a second region by a third region, a plurality of pixel structures arranged within the first region on the substrate, an insulation layer arranged within the first through third regions, the insulation layer having a plurality of openings within the third region, each opening may extend in a first direction and may be spaced-apart from one another in a second direction, the first and second directions may be parallel to the substrate and the second direction may be perpendicular to the first direction and a plurality of connection lines extending in the first direction on the substrate within the first, second and third regions, wherein portions of the connection lines within the first and the second regions may be arranged on the insulation layer, wherein portions of the connection lines within the third region may be spaced-apart from the openings and may be interposed between two adjacent openings, the connection lines may electrically connect the pixel structures to an external device.

The openings within the installation layer may include first through (N)th openings, where N may be an integer greater than 1, and the connection lines may include first through (M)th connection lines, where M may be an integer greater than 1, the insulation layer within the third region may b spatially separated by the openings, and the (L)th connection line among the first through (M)th connection lines may be interposed between (K)th and (K+1)th openings among the first through (N)th openings on the insulation layer, where K may be an integer between 1 and N, and L may be an integer between 1 and M. The OLED device may also include a planarization layer arranged on the connection lines, the planarization layer may include a first via hole within the second region that exposes one of the connection lines; and a pad electrode arranged within the second region, the pad electrode may be in contact with the connection line through the first via hole of the planarization layer.

BRIEF DESCRIPTION OF THE DRAWINGS

A more complete appreciation of the invention, and many of the attendant advantages thereof will be readily apparent as the same becomes better understood. By reference to the following detailed description when considered in conjunction with the accompanying drawings, in which like reference symbols indicate the same or similar components, wherein:

FIG. 2 is a planar view for describing a connection line and opening included within the OLED device of FIG. 1;

DETAILED DESCRIPTION OF THE INVENTION

Hereinafter, embodiments of the present inventive concept will be explained in detail with reference to the accompanying drawings.

Figure 1:
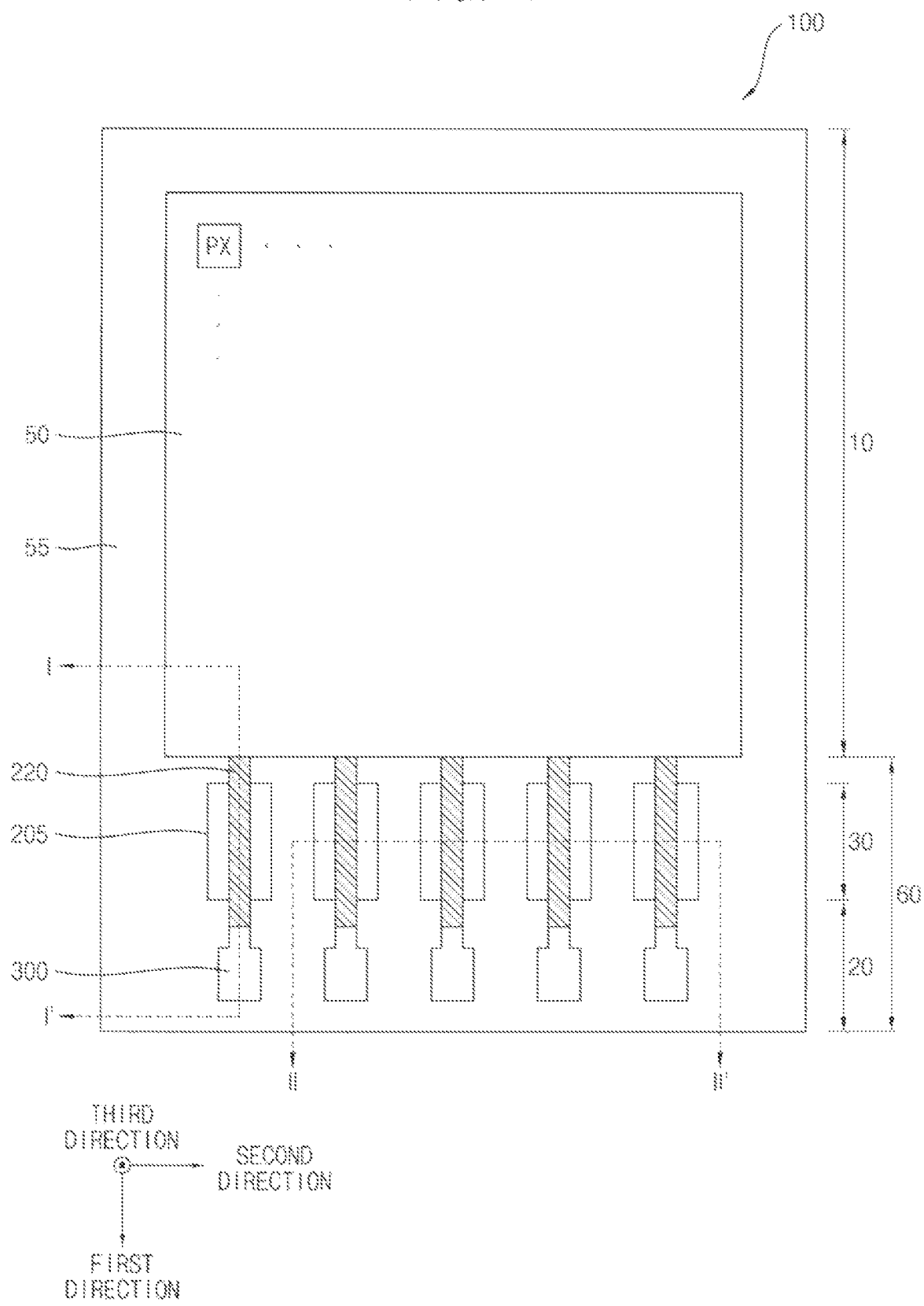
FIG. 1 is a planar view illustrating art organic light emitting display (OLED) device in accordance with example embodiments.
Figure 3:
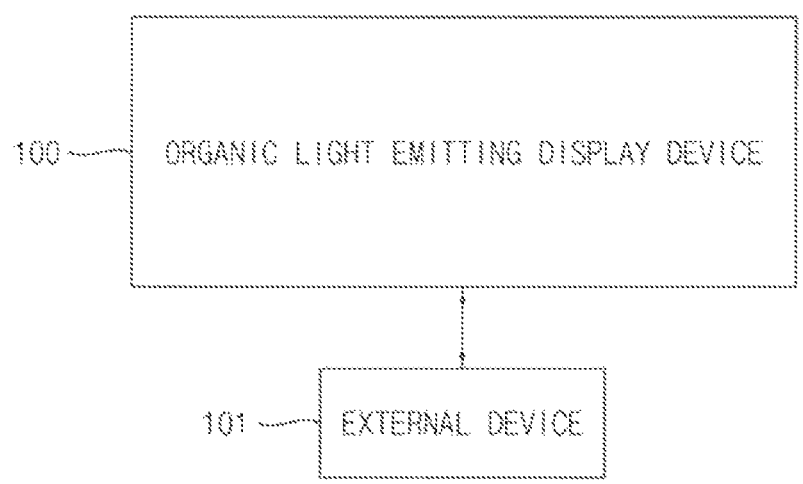
FIG. 3 is a block diagram for describing an external device electrically connected with the OLED device of FIG. 1.

Turning now to FIGS. 1 to 3, FIG. 1 is a planar view illustrating an organic light emitting display (OLED) device in accordance with example embodiments. FIG. 2 is a planar view for describing a connection line and opening included within the OLED device of FIG. 1 and FIG. 3 is a block diagram for describing an external device electrically connected with the OLED device of FIG. 1.

Referring to FIGS. 1 through 3, an organic light emitting display (OLED) device 100 may include a pixel region 50 and a peripheral region 55. Here, the peripheral region 55 may surround the pixel region 50. In addition, the peripheral region 55 may include a pad region 60 including a bend region 30 (e.g., a third region that will be described below). As the bend region 30 can be bent, a portion of the pad region 60 may be located on a lower surface of the OLED device 100, and the peripheral region 55 of the OLED device 100 may be relatively reduced.

A plurality of pixels PX (e.g., pixel structures that will be described below) may be disposed within the pixel region 50 and the pixels PX may display an image. A plurality of common lines (e.g., data signal lines, scan signal lines, emission signal lines, power supply voltage lines, etc) may be disposed within the peripheral region 55, and an insulation layer that will be described below, connection lines 220, pad electrodes 300, etc included within the OLED device 100 may be disposed within the pad region 60. In addition, openings 205 may be formed within the insulation layer to perforate the insulation layer at location corresponding to the bend region 30. For example, each of the connection lines 220 may extend along a first direction that is parallel to an upper surface of a substrate that will be described below and included within the OLED device 100, and the openings 205 expose the substrate by removing the insulation layer may be spaced-apart from one another in a second direction that is perpendicular to the first direction.

In example embodiments, the openings 205 may include first through (N)th openings, where N is an integer greater than 1, and the connection lines 220 may include first through (M)th connection lines, where M is an integer greater than 1. The insulation layer may be spatially separated by the openings 205 within the bend region 30. A (L)th connection line among the first through (M)th connection lines may be disposed on i) at least a portion of each of side walls that are located along the first direction of a (K)th opening among the first through (N)th openings and ii) at least a portion of the substrate exposed by the (K)th opening within the third region (e.g., the bend region 30), where K is an integer between 1 and N, and L is an integer between 1 and M.

For example, the opening 205 of FIG. 2 may be the (K)th opening. As illustrated in FIG. 2, the opening 205 may have side walls 206 and 207 that are located (i.e. spaced-apart by a distance) along the first direction and side walls 208 and 209 that are located (i.e. spaced-apart by a distance) along the second direction. Each connection line 220 may extend along the first direction, and may be disposed on at least a portion of each of the side walls 206 and 207 that are located along the first direction of the opening 205 within the bend region 30 and at least a portion of the substrate exposed by the opening 205 within the bend region 30. As illustrated in FIG. 3, the connection line 220 may electrically connect the pixels PX disposed within the pixel region 50 to an external device 101. For example, the external device 101 may be connected to the OLED device 100 through a flexible printed circuit board (FPCB). The external device 101 may provide data signals, scan signals, emission signals, power supply voltage, etc to the OLED device 100, in addition, a driving integrated circuit may be mounted (e.g., installed) within the FPCB.

Referring again to FIG. 2, in example embodiments, a width W2 in the second direction of the opening 205 may be greater than a width W1 in the second direction of the connection line 220. For example, as the opening 20 is formed, a step of the insulation layer (e.g., difference of levels) within the bend region 30 may be increased. As the step is increased within the bend region 30, the connection line 220 may not be completely etched (or patterned) within the opening 205 after a process etching, a preliminary connection fine layer formed on the entire substrate. However, in example embodiments, an etching residue of the connection line 220 may remain within the opening 205, and each of the connection lines 220 may be disposed in each of the openings 20. For example, the etching residue may remain along a boundary of the insulation layer and the substrate within the opening 205. In this case, although the etching residue remains within the opening 205, the neighboring connection lines 220 may not be shorted together. That is, the neighboring connection lines 220 may not be electrically connected by the etching residue. Accordingly, although the insulation layer of the bend region 30 is removed to allow for bending or folding of the bend region 30, the OLED device 100 may serve as a flexible OLED device without the shorting together the connection lines 220.

On the other hand, a conventional OLED device has one opening in the bend region 30. For example, the opening may expose an entire substrate by removing an insulation layer in the bend region 30. In this case, as the opening is formed, a step of the insulation layer within the bend region 30 may be increased. As the step is increased within the bend region 30, each of connection lines may not be completely etched within the opening after a process etching a preliminary connection line, layer formed on the entire substrate. That is, an etching residue of the connection line may remain within the opening. Here, the etching residue may remain along a boundary of the insulation layer and the substrate. As a result, the etching residue may be in directly contact with the connection lines, and the etching residue may electrically connect adjacent connection lines to each other. Thus, when the conventional OLED device may have one opening in the bend region 30, the connection electrodes may be shorted.

In example embodiments, the OLED device 100 includes five connection lines 220 and five openings 205 within the pad region 60, but not being limited thereto. In some example embodiments, for example, the OLED device 100 may include a plurality of connection lines 220 and a plurality of openings 205.

In addition, a shape of the opening 205 of FIG. 1 has a planar shape of a substantially rectangular shape, but is not limited thereto. For example, a shape of the opening 205 may instead have a planar shape of a substantially triangle shape, a substantially diamond shape, a substantially polygonal shape, a substantially circular shape, a substantially track shape, or a substantially elliptical shape.

Figure 4:
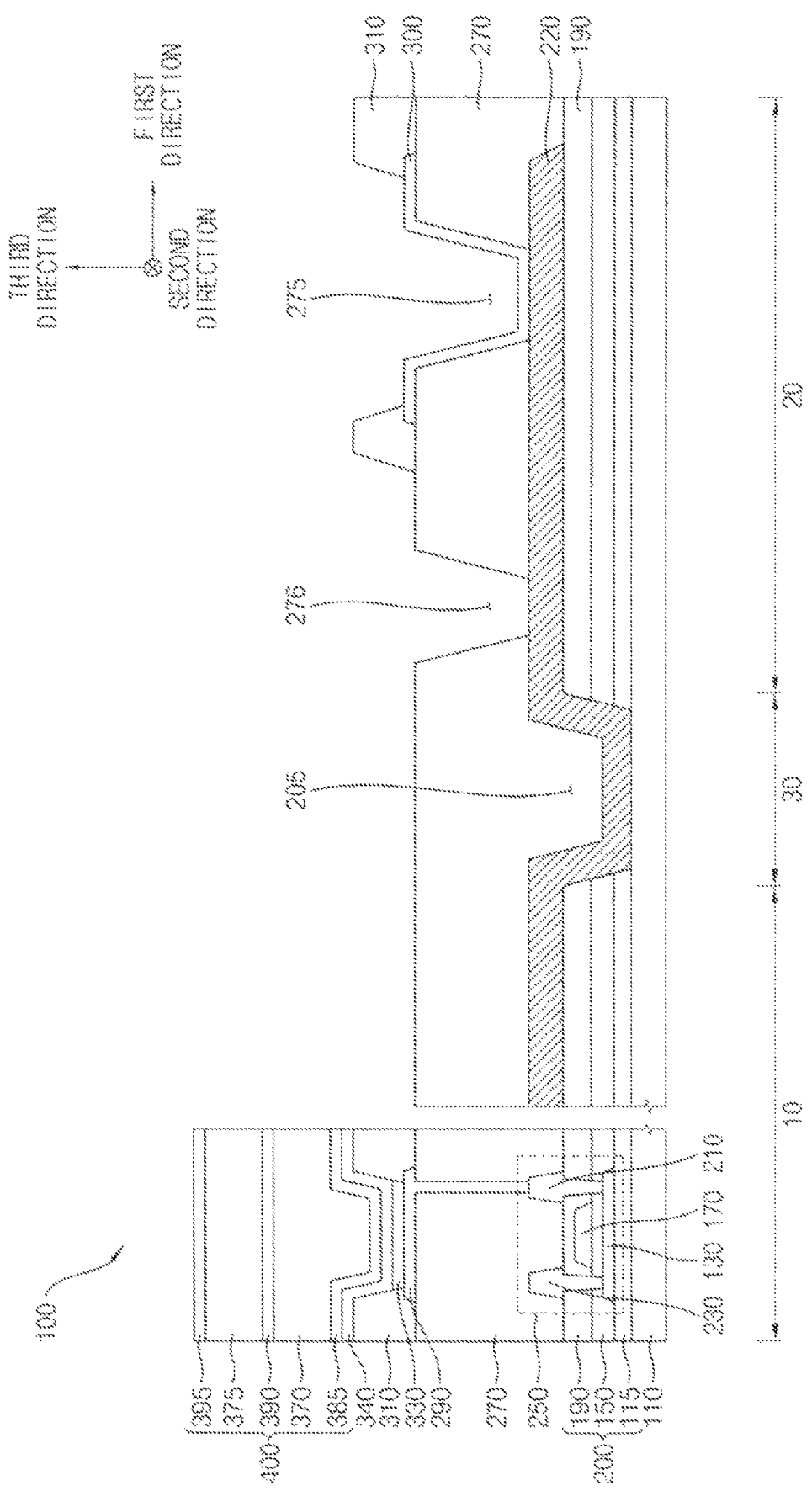
FIG. 4 is a cross-sectional view taken along a line I-I' of FIG. 1.
Figure 5:
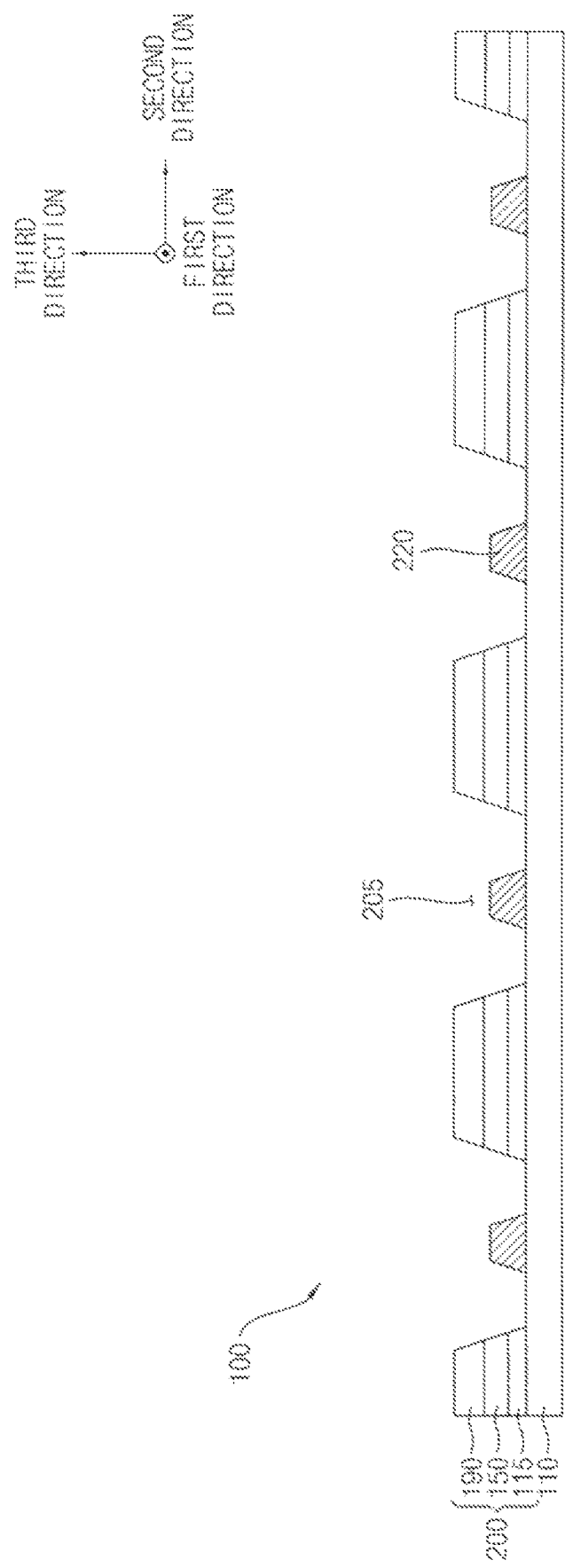
FIG. 5 is a cross-sectional view taken along a line II-II' of FIG. 1.

Turning now to FIGS. 4 and 5, FIG. 4 is a cross-sectional view taken along a line of FIG. 1, and FIG. 5 is a cross-sectional view taken along a line II-II' of FIG. 1. Referring to FIGS. 4 and 5, an organic light emitting display (OLED) device 100 may include a substrate 110, a pixel structure, an insulation layer 200, a thin film encapsulation structure 400, a connection line 220, a pad electrode 300, a planarization layer 270, a pixel defining layer 310, etc. Here, the pixel structure may include a semiconductor element 250, a first electrode 290, a light emitting layer 330, and a second electrode 340. The semiconductor element 250 may include an active layer 130, a gate electrode 170, a source electrode 230, and a drain electrode 210. The insulation layer 200 may include a buffer layer 115, a gate insulation layer 150, and an insulating interlayer 190. The thin film encapsulation structure 400 may include a first thin film encapsulation layers 385, 390, and 395 and a second thin film encapsulation layers 370 and 375.

As described above, the OLED device 100 may include a pixel region having a plurality of pixels and a peripheral region. The peripheral region may include a pad region 60 having a bend region 30. In example embodiments, the substrate 110 may include a first region 10, a second region 20, and a third region 30. The bend region may be the third region 30, and the first region 10 may be the pixel region and a portion of the pad region. The second region 20 may be a region where the OLED device 100 and an external device are electrically connected. For example, the second region 20 may be spaced-apart from the first region 10 by the third region 30. The pixel structures and a portion of the connection line 220 may be disposed within the first region 10, and the opening 205 may be located within the third region 30.

The pixel structure and a portion of the connection line 220 may be disposed within the first region 10 on the substrate 110, and a portion of the connection line 220 and the opening 205 may be disposed within the third region 30. In addition, the pad electrode 300 and a portion of the connection line 220 may be disposed within the second region 20.

The substrate 110 may be formed of transparent materials. For example, the substrate 110 may include a flexible transparent material such as a flexible transparent resin substrate. For example, the polyimide substrate may include a first polyimide layer, a first barrier film layer, a second polyimide layer, a second barrier film layer etc. Since the polyimide substrate is relatively thin and flexible, the polyimide substrate may be disposed on a rigid glass substrate to help support the formation of the pixel structure. That is, the substrate 110 may have a structure in winch the first polyimide layer, the first banter film layer, the second polyimide layer, and the second barrier film layer are stacked on the rigid glass substrate. In a manufacturing the OLED device 100, after the buffer layer 115 is provided on the second barrier film layer of the polyimide substrate, the pixel structure (e.g., the semiconductor element 250, the first electrode 290, the light emitting layer 330, the second electrode 340, etc.) may be disposed on the buffer layer 115. After the pixel structure is formed on the buffer layer 115, the rigid glass substrate on which the polyimide substrate is disposed may be removed. It may be difficult to directly form the pixel structure on the polyimide substrate because the polyimide substrate is relatively thin and flexible. Accordingly, the pixel structure is formed on the polyimide substrate and the rigid glass substrate, and then the polyimide substrate may serve as the substrate 110 of the OLED device 100 after the removal of the rigid glass substrate. Alternatively, the substrate 110 may be formed of a quartz substrate, a synthetic quartz substrate, a calcium fluoride substrate, a fluoride-doping quartz substrate, a sodalime substrate, a non-alkali substrate etc.

A buffer layer 115 may be disposed on the substrate 110. The buffer layer 115 may extend along a first direction from first region 10 to the second region 20. That is, the buffer layer may be disposed within the first region 10 and the second region 20 on the entire substrate 110, in example embodiments, the buffer layer 115 may include opening 205 exposing the substrate 110 within the third region 30. The buffer layer 115 may prevent the diffusion of metal atoms and/or impurities from the substrate 110. Additionally, the buffer layer 115 may control a rate of a heat transfer in a crystallization process in forming the active layer 130, thereby obtaining substantially a uniform active layer 130. Furthermore, the buffer layer 115 may improve a surface flatness of the substrate 110 when a surface of the substrate 110 is relatively irregular. According to a type of the substrate 110, at least two buffer layers may be provided on the substrate 110 or the buffer layer nay not be disposed. For example, the buffer layer. 115 may include silicon compound, metal oxide, etc.

The semiconductor element 250 may be formed of the active layer 130, the gate electrode 170, the source electrode 230, and the drain electrode 210. For example, the active layer 130 may be disposed within the first region 10 on the substrate 110. The active layer 130 may be formed of an oxide semiconductor, an inorganic semiconductor e.g., amorphous silicon, polysilicon, etc.), an organic semiconductor, etc. In example embodiments, the semiconductor element 250 of the OLED device 100 has a top gate structure, but is not limited thereto. In some example embodiments, the semiconductor element may instead have a bottom gate structure.

The gate insulation layer 150 may be disposed on the active layer 130. The gate insulation layer 150 may cover the active layer 130 within the first region 10, and may extend along the first direction on the substrate 110. That is, the gate insulation layer 150 may be disposed within the first region 10 and the second region 20 on the entire substrate 110. The gate insulation layer 150 may sufficiently cover the active layer 130, and may have a substantially level surface without a step around the active layer 130. Alternatively, the gate insulation layer 150 may cover the active layer 130, and may be disposed as a substantially uniform thickness along a profile of the active layer 130. In example embodiments, the gate insulation layer 150 may include openings 205 exposing the substrate 110 within the third region 30. The gate insulation layer 150 may be formed of silicon compound, metal oxide, etc.

The gate electrode 170 may be disposed on a portion of the gate insulation layer 150 under which the active layer 130 is located. The gate electrode 170 may be formed of a metal, an alloy, metal nitride, conductive metal oxide, transparent conductive materials, etc.

The insulating interlayer 190 may be disposed on the gate electrode 170. The insulating, interlayer 190 may cover the gate electrode 170 within the first region 10, and may extend along the first direction on the substrate 110. The insulating interlayer 190 may sufficiently cover the gate electrode 170, and may have a substantially level surface without a step around edges of the gate electrode 170. Alternatively, the insulating interlayer 190 may cover the gate electrode 170, and may be disposed as a substantially uniform thickness along a profile of the gate electrode 170. That is, the insulating interlayer 190 may be disposed within the first region 10 and the second region 20 on the entire substrate 110, in example embodiments, the insulating interlayer 190 may include opening 205 exposing the substrate 110 within the third region 30. The insulating interlayer 190 may include silicon compound, metal oxide, etc.

The source electrode 230 and the drain electrode 210 may be disposed within the first region 10 on the insulating interlayer 190. The source electrode 230 may be in contact with a first portion of the active layer 130 by removing a portion of the gate insulation layer 150 and the insulating interlayer 190. The drain electrode 210 may be in contact with a second portion of the active layer 130 by removing another portion of the gate insulation layer 150 and the insulating interlayer 190. Each of the source electrode 310 and the drain electrode 210 may be formed of a metal, an alloy, metal nitride, conductive metal oxide, transparent conductive materials, etc.

The connection line 220 may be disposed in at least a portion of a pixel region of FIG. 1, and may extend along the first direction on the insulating interlayer 190. As the connection line 220 is disposed in at least a portion of the pixel region, the connection line 220 may be electrically connected to the pixel structure. Thus, the connection line 220 may electrically connect the pixel structure disposed within the pixel region to an external device of FIG. 3. As described above, the external device 101 may be electrically connected to the pad electrode 300 of the OLED device 100 through a flexible printed circuit board (FPCB), and the external device 101 may provide data signals scan signals, emission signals, power supply voltages, etc to the OLED device 100.

Referring again to FIG. 4, the connection line 220 may be disposed within the first region 10 and the second region 20 on the insulating interlayer 190, and may be disposed on side walls located along the first direction of the openings 205 within the third region 30 and on portions of the substrate 110 exposed by the openings 205 within the third region 30.

The third region 30 may be bent or folded. When the third region 30 is bent or folded, the second region 20 may be located in a lower surface of the OLED device 100. To bend or fold the third region 30, as the insulation layer 200 located within the third region 30 is removed, a neutral plane of the third region 30 may go down (or drop) in a third direction that is vertical to the first and second directions. Here, when an object is bent, a plane that is neither increased, nor decreased in cross-sectional size may be referred to as the neutral plane of the object. In a case where the object comprises the same material, the neutral plane may correspond to a midplane of the object. Otherwise, when the object comprises at least two materials such as, for example, a composite material), the neutral plane may be different from the midplane of the object. When an OLED device is bent without removal of the insulation layer, as described above, the neutral plane is formed within the insulation layer of the OLED device, and then the insulation layer may be damaged or snapped. Meanwhile, when the connection line is disposed after removal of the entire insulation layer within openings 205 of the third region 30, a step of the insulation layer may be increased, and thus the connection line may not be completely etched (e.g., patterned) within the third region 30 where the insulation layer is fully removed after a process etching a preliminary connection line layer formed on the entire substrate. That is, an etching residue of the connection line may remain within the third region 30. For example, the etching, residue may remain along a boundary of the insulation layer and the substrate within the opening 205. Thus, adjacent connection lines may be shorted to each other.

As illustrated in FIGS. 4 and 5, the connection line 220 may be disposed on at least a portion of side walls that are located along the first direction of the opening 205 and at least a portion of the exposed substrate 110. For example, as the opening 205 is formed, a step of the connection line 220 for the insulation layer 200) may be increased within the third region 30. As the step is increased within the third region 30, the connection line 220 may not be completely etched (e.g., patterned) within the opening 205 after a process etching a preliminary connection line layer formed on the entire substrate 110. However, in example embodiments, an etching residue of the connection line 220 may remain within the opening 205, and each of the connection lines 220 may be disposed within each of the openings 205. In this case, although the etching residue remains within the opening 205, the neighboring connection fines 220 may not be shorted to each other. The connection line 220 may include a metal, an alloy, metal nitride, conductive metal oxide, transparent conductive materials, etc. For example, the connection hue 220 may include aluminum (Al), an alloy of aluminum, aluminum nitride (AlNx) silver (Ag), an alloy of silver, tungsten (W) tungsten nitride (WNx), copper (Cu), an alloy of copper nickel (Ni), chrome (Cr), chrome nitride (CrNx), molybdenum (Mo), an alloy of molybdenum, titanium (Ti), titanium nitride (TiNx), platinum (Pt), tantalum (Ta), tantalum nitride (TaNx), neodymium (Nd), scandium (Sc), strontium ruthenium oxide (SRO), zinc oxide (ZnOx), stannum oxide (SnOx), indium oxide (InOx), gallium oxide (GaOx), indium tin oxide (ITO), indium zinc oxide (IZO), etc. These may be used alone or in a suitable combination thereof in example embodiments, the connection lines 220 may have a stacked structure, and the stacked structure may be formed of Ti/Al/Ti. The connection lines 220, the source electrodes 230 and the drain electrodes 210 may be simultaneously formed using the same materials. Accordingly, within the first region 10, the semiconductor element 250 including the active, layer 130, the gate electrode 170, the drain electrode 210, and the source electrode 230 may be disposed.

The planarization layer 270 may be disposed on the source electrode 230, the drain electrode 210, and the connection line 220. The planarization layer 270 may cover the source electrode 230, the drain electrode 210, and the connection line 220 within the first region 10, and may extend along the first direction on the insulating interlayer 190. That is, the planarization layer 270 may be disposed within the first region 10, the second region 20, and the third region 30 on the entire insulating interlayer 190. In example embodiments, the planarization layer 270 may have a first via hole 275 exposing the connection line 220 within the second region 20 and a second via hole 276 exposing the connection line 220 at a location that is adjacent to boundary of the second region 20 and the third region 30. The second is hole 276 may block moisture or water that has permeated from the outside into the OLED device 100. The planarization layer 270 may sufficiently cover the source electrode 230, the drain electrode 210, and the connection line 220, and may have a substantially level surface without a step around the source electrode 230, the drain electrode 210, and the connection line 220. Alternatively, the planarization layer 270 may cover the source electrode 230, the drain electrode 210, and the connection line 220, and may be disposed to have a substantially uniform thickness along a profile of the source electrode 230, the drain electrode 210, and the connection line 220. The planarization layer 270 may include organic materials or inorganic materials. In example embodiments, the planarization layer 270 may include organic materials such as a polyimide-based resin, a photoresist, an acryl-based resin, a polyamide-based resin, a siloxane-based resin, etc.

The first electrode 290 may be disposed within, the first region 10 on the planarization layer 270. The first electrode 290 may be in contact with the drain electrode 210 by removing a portion of the planarization layer 270. As a result, the first electrode 290 may be electrically connected to the semiconductor element 250. The first electrode 290 may be formed of a metal, an alloy, metal nitride, conductive metal oxide, transparent conductive materials, etc.

The pad electrode 300 may be disposed within the second region 20 on the planarization layer 270. The pad electrode 300 may be m contact with the connection line 220 through the first via hole 275. As described above, the pixel structure and the external device may be electrically connected together by connection line 220 by contacting the FPCB to the pad electrode 300. In example embodiments, the pad electrode 300 may have a stacked structure. The stacked structure may include ITO/Ag/ITO. The pad electrode 300 and the first electrode 290 may be simultaneously formed using the same materials.

The pixel defining layer 310 may expose as portion of the first electrode 290 within the first region 10 on the planarization layer 270, and may expose a portion of the pad electrode 300 within the second region. 20 on the planarization layer 270. After a process etching a preliminary first electrode layer and a preliminary pad electrode layer formed on the entire planarization) layer 270, the pixel defining layer 310 may cover both lateral portions (i.e. edge portions) of the etched first electrode 290 and both lateral portions (i.e. edge portions) of the etched pad electrode 300. This is because particles are generated in both lateral portions of the etched first electrode 290 and both lateral portions of the etched pad electrode 300. The pixel defining layer 310 may include organic materials or inorganic materials. In example embodiments, the pixel defining layer 310 may include organic, materials.

The light emitting layer 330 may be disposed on the first electrode 290 exposed by the pixel defining layer 310. The light emitting layer 330 may have a multi-layered structure including an emission layer (EL), a hole injection layer (HIL), a hole transfer layer (HTL), an electron transfer layer (ETL), and an electron injection layer (EIL). The EL of the light emitting layer 330 may be formed using at least one of light emitting materials capable of generating different colors of light (e.g., a red color of light, a blue color of light, and a green color of light, etc) according to sub-pixels. Alternatively, the EL of the light emitting layer 330 may generally generate a white color of light by stacking a plurality of light emitting materials capable of generating different colors of light such as a red color of light, a green color of light, a blue color of light, etc.

The second electrode 340 may be disposed on the pixel defining layer 310 and on the light emitting layer 330. The second electrode 340 may cover the pixel defining layer 310 and the light emitting layer 330 within the first region 10, and may extend along the first direction on the substrate 110. The second electrode 340 may be formed of a metal, a metal alloy metal nitride, conductive metal oxide, transparent conductive materials, etc.

The thin film encapsulation structure 400 may be disposed on the second electrode 340. The thin film encapsulation structure 400 may include at least one the first thin film encapsulation layer 385 and at least one the second thin film encapsulation layer 370. For example, the second thin film encapsulation layer 370 may be disposed on the first thin film encapsulation layer 385. The first thin film encapsulation layer 385 and the second thin film encapsulation layer 370 may be alternately and repeatedly arranged. The first thin film encapsulation layer 385 may cover the second electrode 340, and may be disposed to a substantially uniform thickness along a profile of the second electrode 340. The first thin film encapsulation layer 385 may prevent the pixel structure horn being deteriorated by the permeation of moisture, water, oxygen, etc. In addition, the first thin film encapsulation layer 385 may protect the pixel structure horn external impact. The first thin film encapsulation layer 385 may include inorganic materials.

The second thin film encapsulation layer 370 may be disposed on the first thin film encapsulation layer 385. The second thin film encapsulation layer 370 may improve the flatness of the OLED device 100, and may protect the pixel structure within the first region 10. The second thin film encapsulation layer 370 may include organic materials.

The first thin film encapsulation layer 390 may be disposed on the thin film second encapsulation layer 370. The first thin film encapsulation layer 390 may cover the second thin film encapsulation layer 370, and may be disposed as a substantially uniform thickness along a profile of the second thin film encapsulation layer 370. The first thin film encapsulation layer 390 together with the first thin film encapsulation layer 385 and the second thin film encapsulation layer 370 may protect the pixel structure from being deteriorated by the permeation of moisture, water, oxygen, etc. In addition, the first thin film encapsulation layer 390 together with the first thin film encapsulation layer 385 and the second thin film encapsulation layer 370 may protect the pixel structure from external impact. The first thin film encapsulation layer 390 may include inorganic materials.

The second thin film encapsulation layer 375 may be disposed on the first thin film encapsulation layer 390. The second thin film encapsulation layer 375 may perform functions substantially the same as or similar to those of the second thin film encapsulation layer 370, and the second thin film encapsulation layer 375 may include a material substantially the same as or similar to that of the second thin film encapsulation layer 370.

The first thin film encapsulation layer 395 may be disposed on the second thin film encapsulation layer 375. The first thin film encapsulation layer 395 may perform functions substantially the same as or similar to those of the first thin film encapsulation layers 385 and 390, and the first thin film encapsulation layer 395 may include a material substantially the same as or similar to that of the first thin film encapsulation layers 385 and 390.

Alternatively, the thin film encapsulation structure 400 may have a three-layered structure having the first thin film encapsulation layer 385, the second thin film encapsulation layer 370, and the first thin film encapsulation layer 390 or a seven-layered structure having the first thin film encapsulation layer 385, the second thin film encapsulation layer 370, the first thin film encapsulation layer 390, the second thin film encapsulation layer 375, the first thin film encapsulation layer 395, an extra first thin film encapsulation layer, and an extra second thin film encapsulation layer.

The OLED device 100 in accordance with example embodiments includes the openings 205 within the third region 30, and each of the connection lines 220 may be disposed in each of the openings 205. Accordingly, although the insulation layer 200 of the third region 30 is removed in portions to allow for bending or folding of the third region 30, the OLED device 100 may serve as a flexible OLED device without shorting together of neighboring connection lines 220.

Figure 6:
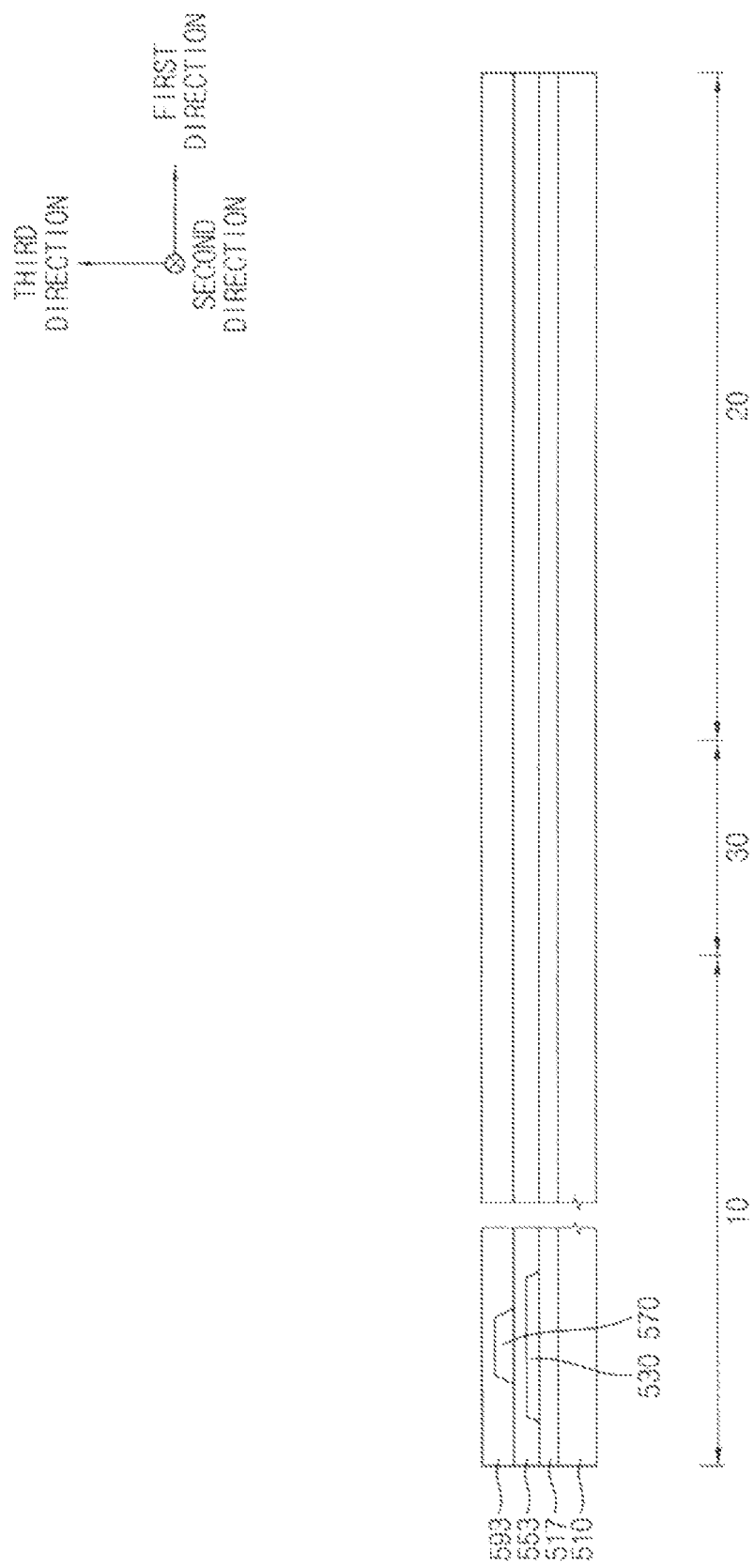
FIG. 6 is a cross-sectional view illustrating a method of manufacturing an OLED device where the base insulating layer is produced.
Figure 7:
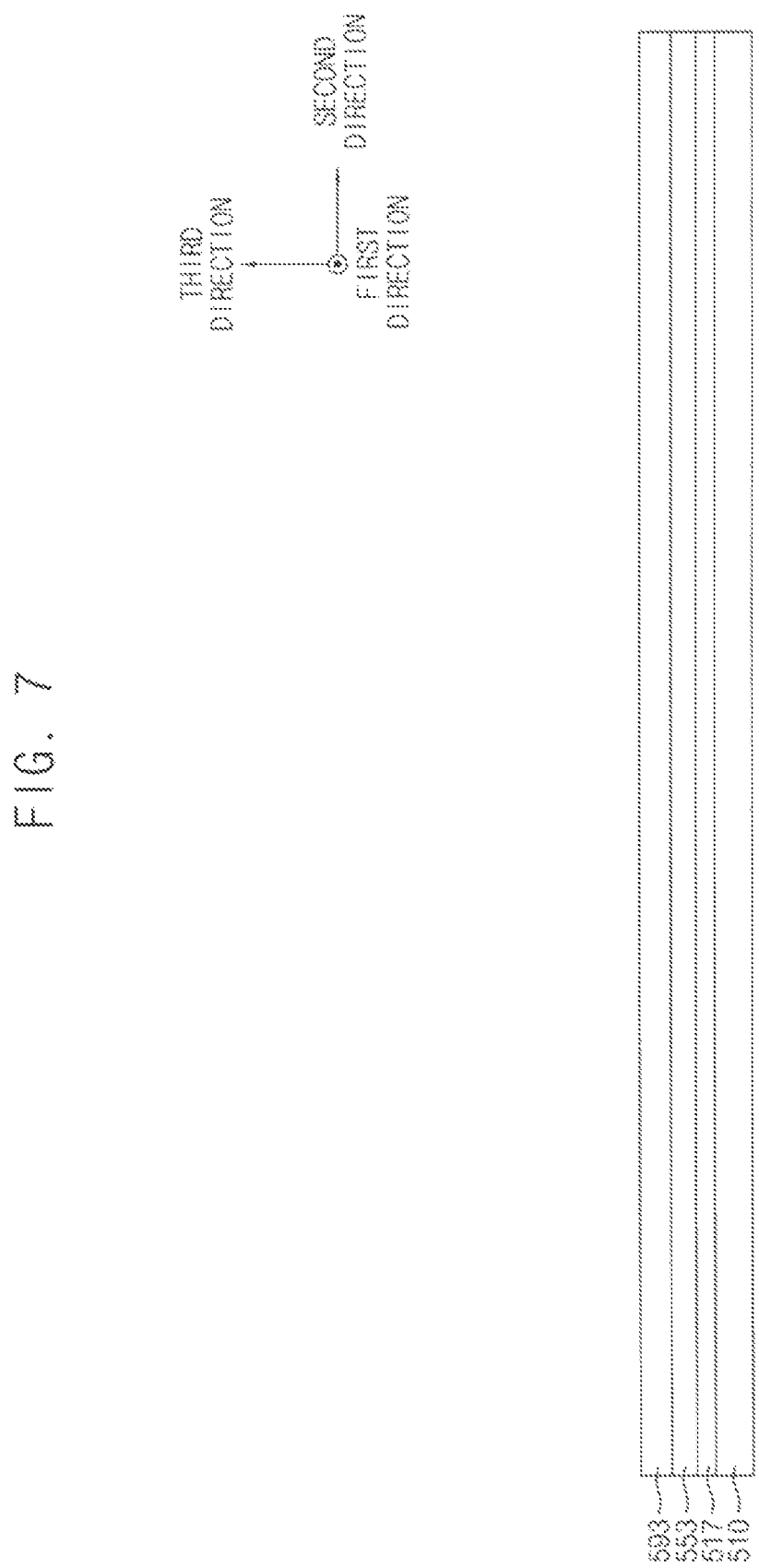
FIG. 7 is a another cross-sectional view but along another direction illustrating a method of manufacturing an OLED device where the base insulating layer is produced.

Turning now to FIGS. 6 to 13, FIGS. 6 to 13 are cross-sectional views illustrating a method of manufacturing an OLED device in accordance with example embodiments. Referring now to FIGS. 6 and 7, a substrate 510 may be provided. The substrate 510 may be formed using a flexible transparent material such as a flexible transparent resin substrate. A preliminary buffer layer 517 may be formed in a first direction on a substrate 510. The preliminary buffer layer 517 may extend along a first direction from the first region 10 to a second region 20. That is, the preliminary buffer layer 517 may be formed on the entire substrate 510, and may prevent the diffusion of metal atoms and/or impurities from the substrate 510. The preliminary buffer layer 517 may be formed using silicon compound, metal oxide, etc.

An active layer 530 may be formed within the first region 10 on the substrate 510. The active layer 530 may be formed using an oxide semiconductor, an inorganic semiconductor, an organic semiconductor, etc. A preliminary gate insulation layer 553 may be formed on the substrate 510. The preliminary gate insulation layer 553 may cover the active layer 330 within the first region 10, and may extend along the first direction of the substrate 510. The preliminary gate insulation layer 553 may be formed within the first region 10, the second region 20, and the third region 30 on the entire substrate 510. The preliminary gate insulation layer 553 may sufficiently cover the active layer 530, and may have a substantially level surface without a step around the active layer 530. The preliminary gate insulation layer 553 may be formed using silicon compound, metal oxide, etc.

The gate electrode 570 may be formed on the preliminary gate insulation layer 553. The gate electrode 570 may be formed on a portion of the preliminary gate insulation layer 553 under which the active layer 530 is located. The gate electrode 570 may be formed using a metal, an alloy, metal nitride, conductive metal oxide, transparent conductive materials, etc. A preliminary insulating interlayer 593 may be formed on the gate electrode 570. The preliminary insulating interlayer 593 may cover the gate electrode 570, and may extend along the first direction on the preliminary gate insulation layer 553. The preliminary insulating interlayer 593 may be formed within the first region 10, the second region 20, and the third region 30 on the entire substrate 510. The preliminary insulating interlayer 593 may sufficiently cover the gate electrode 570, and may have a substantially level top surface without a step around the gate electrode 570. The preliminary insulating interlayer 593 may be formed using silicon compound, metal oxide, etc.

Figure 8:
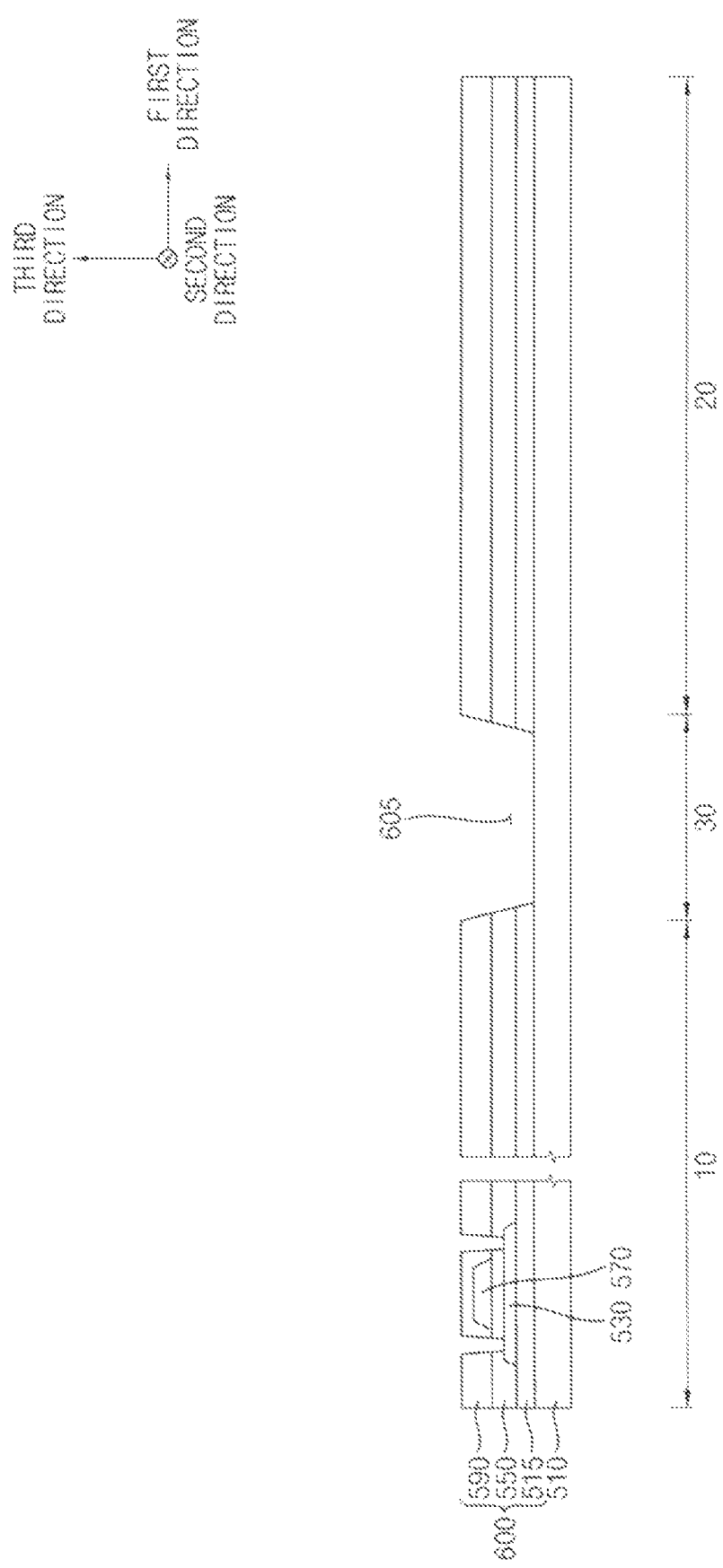
FIG. 8 is a cross-sectional view illustrating a method of manufacturing an OLED device where the openings are finned within the base insulating layer.
Figure 9:
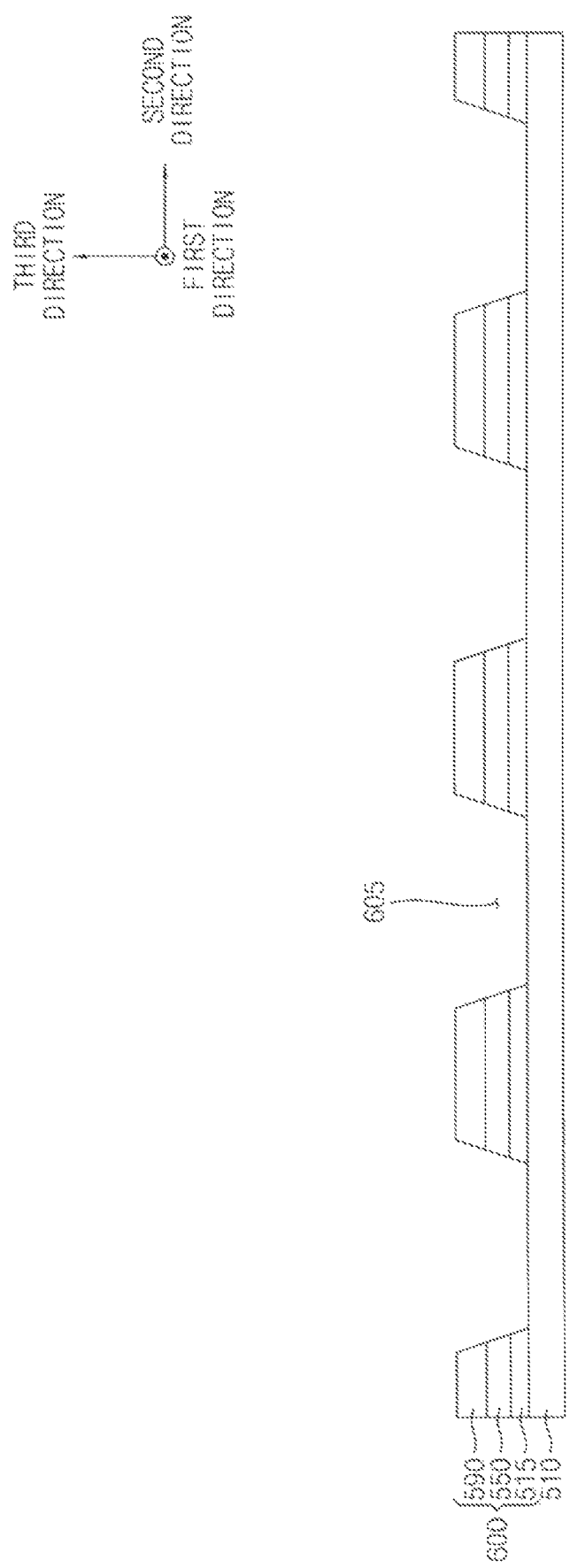
FIG. 9 is another cross-sectional view illustrating a method of manufacturing an OLED device where the openings are formed within the base insulating layer.

Referring now to FIGS. 8 and 9, a source region of the active layer 530 may be exposed by removing a first portion of the preliminary gate insulation layer 553 and the preliminary insulating interlayer 593 within the first region 10. In addition, a drain region of the active layer 530 may be exposed by removing a second portion of the preliminary gate insulation layer 553 and the preliminary insulating interlayer 593 within the first region 10. Openings 605 may be formed by removing the preliminary buffer layer 517, the preliminary gate insulation layer 553, and the preliminary insulating interlayer 593 within the third region 30. In this case, the openings 605 may be formed so that they are spaced-apart from each other in the second direction that is perpendicular to the first direction, as illustrated in FIG. 9. In this way, an insulation layer 600 including, a buffer layer 515, a gate insulation layer 550, and an insulating interlayer 590 may be formed.

Figure 10:
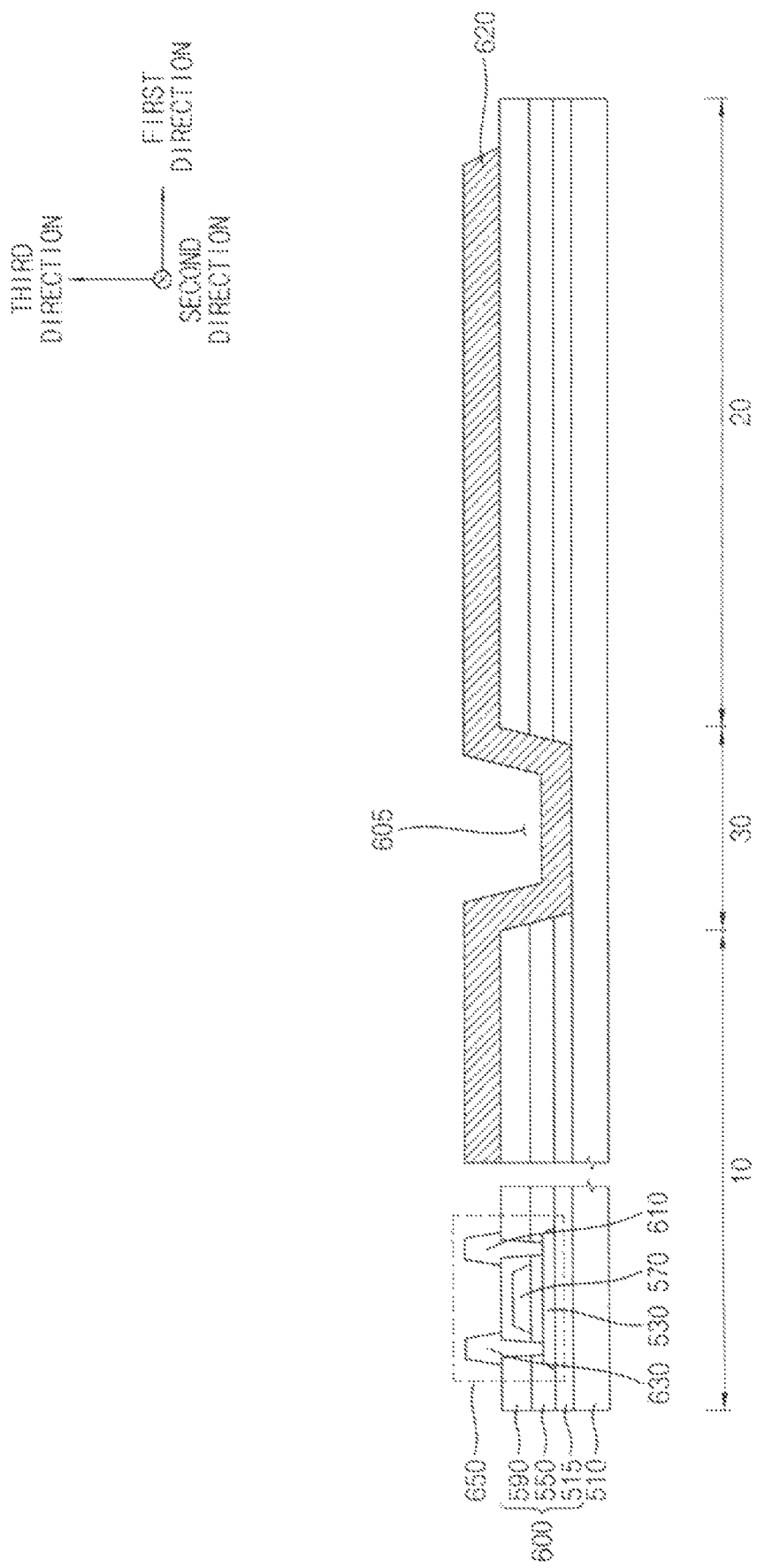
FIG. 10 is a cross-sectional view illustrating a method of manufacturing an OLED device where the connection lines are produced.
Figure 11:
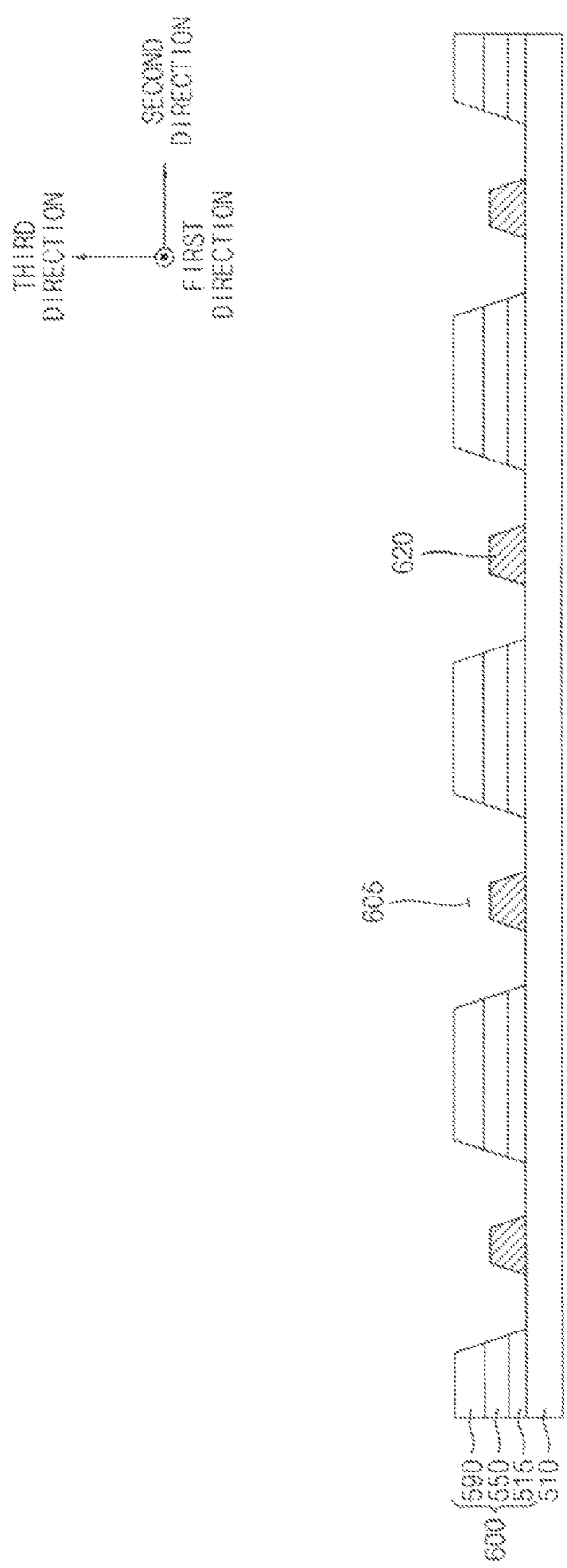
FIG. 11 is another cross-sectional view in another direction illustrating a method of manufacturing an OLED device where the connection lines are produced.

Referring now to FIGS. 10 and 11, a source electrode 630, a dram electrode 610 and a portion of a connection line 620 may be formed within the first region 10 on the insulating interlayer 590. Each of the source electrode 630 and the drain electrode 610 may fill the first and second portions of the gate insulation layer 550 and the insulating interlayer 590 within the first region 10, and may be in contact with each of the source and drain regions of the active layer 530. Each of the source electrode 630 and the drain electrode 610 may be formed using a metal, an alloy, metal nitride, conductive metal oxide, transparent conductive materials, etc.

The connection line 620 may be formed in at least a portion of a pixel region of FIG. 1, and may extend in the first direction on the insulating interlayer 590. The connection line 620 may be formed within the first region 10 and the second region 20 on the insulating interlayer 590. As illustrated in FIG. 10, the connection lines 620 may be formed on side walls that are located along the first direction of the opening 605 within the third region 30 and on a portion of the substrate 510 exposed by the opening 605 within the third region 30.

The connection line 620 may be formed on at least a portion of side walls that are located along the first direction and at least a portion of the substrate 510 exposed by the openings 605 within the third region 30. For example, as the openings 605 are formed, a step of the connection line 620 for insulation layer 600) may be increased within the third region 30. As the step is increased within the third region 30, the connection line 620 may not be completely etched (e.g., patterned) within the openings 605 after a process etching a preliminary connection line layer thrilled on the entire substrate 510. However, in example embodiments, an etching residue of the connection line 620 may remain within the openings 605, and each of the connection lines 620 may be formed in each of the openings 605. In this case, although the etching residue remains within the openings 605, the neighboring connection lines 620 may not be shorted together, especially since an unetched portion of the insulation layer 600 is interposed between each pair of adjoining connection lines 620.

The connection line 620 may be formed using a metal, an alloy, metal nitride conductive metal oxide, transparent conductive materials, etc. For example, the connection line 620 may be formed of Al, an alloy of aluminum, AlNx, Ag, an alloy of silver, W, WNx, Cu, an alloy of copper, Ni, Cr, CrNx, Mo, an alloy of molybdenum, Ti, TiNx, Pt, Ta, TaNx, Nd, Sc, SRO, ZnOx, SnOx, InOx, GaOx, ITO, IZO, etc. These may be used alone, or in a suitable combination thereof. In example embodiments, the connection line 620 may have a stacked structure, and the stacked structure may be formed of Ti/Al/Ti. The connection line 620, the source electrode 630, and the drain electrode 610 may be simultaneously formed using the same materials. Accordingly, within the first region 10, the semiconductor element 650 including the active layer 530, the gate electrode 570, the drain electrode 610, and the source electrode 630 may be formed.

Figure 12:
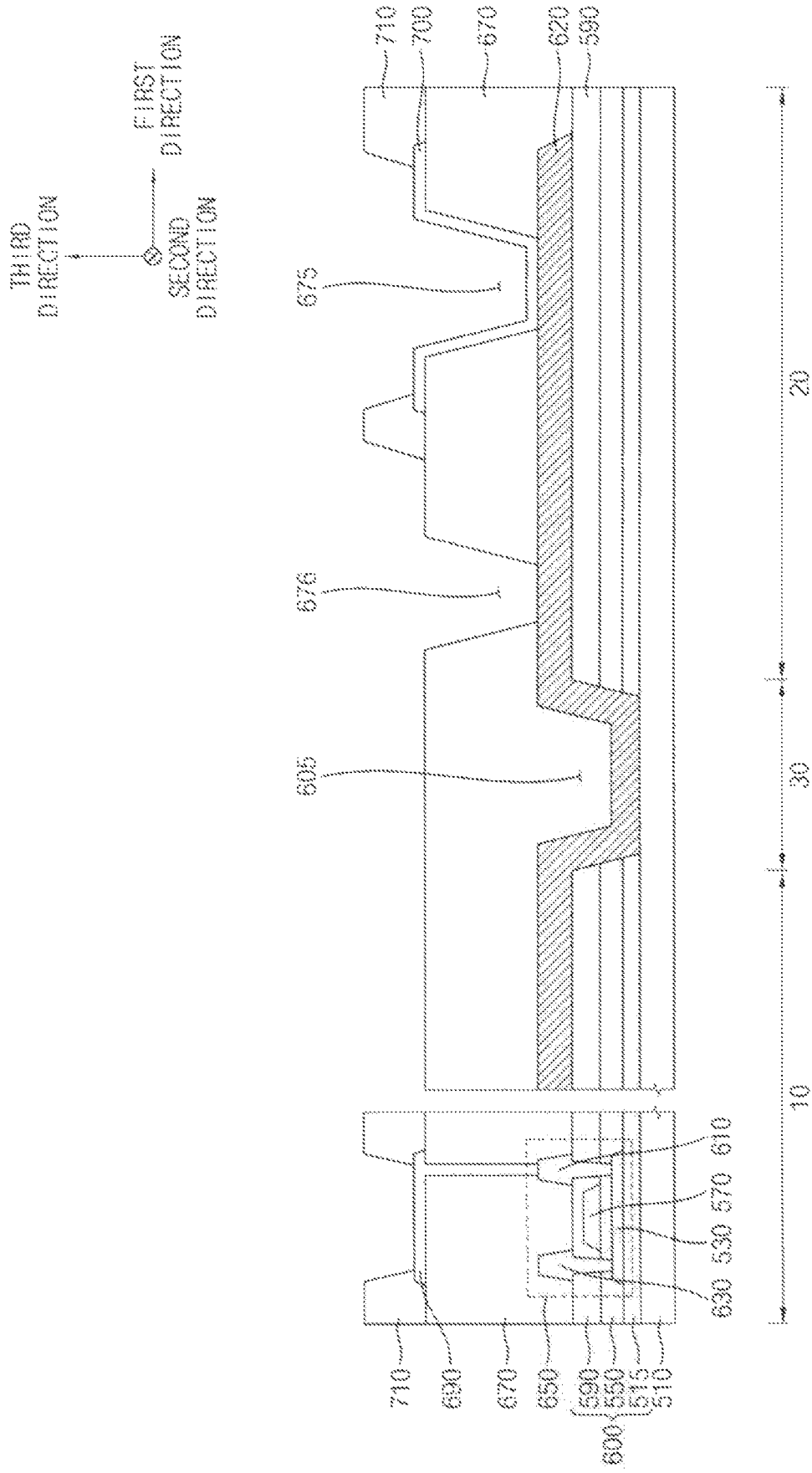
FIG. 12 is a cross-sectional view illustrating a method of manufacturing an OLED device where the pads, the via holes and the pixel defining layer are produced.

Referring now to FIG. 12, a planarization layer 670 may be formed on the source electrode 630, the drain electrode 610, and the connection line 620. The planarization layer 670 may cover the source electrode 630, the drain electrode 610, and the connection line 620 within the first region 10, and may extend along the first direction on the insulating interlayer 590. That is, the planarization layer 670 may be formed within the first region 10, the second region 20, and the third region 30 on the entire insulating interlayer 590. In example embodiments, the planarization layer 670 may have a first via hole 675 exposing the connection line 620 within the second region 20 and a second via hole 676 exposing the connection line 620 at a location that is adjacent to boundary of the second region 20 and the third region 30. The second via hole 676 may block moisture or water that has permeated from the outside into the OLED device. The planarization layer 670 may be formed to have a high thickness to sufficiently cover the source electrode 630, the dramgram electrode 610, and the connection fine 620. In this case, the planarization layer 670 may have a substantially flat upper surface, and a planarization process may be further performed on the planarization layer 670 to implement the flat upper surface of the planarization layer 670. The planarization layer 670 may be formed using organic materials or inorganic materials. In example embodiments, the planarization layer 670 may include organic materials such as a polyimide-based resin, a photoresist, an acryl-based resin, a polyamide-based resin, a siloxane-based resin, etc.

A first electrode 690 may be formed within the first region 10 on the planarization layer 670. The first electrode 690 may be in contact with the drain electrode 610 by removing a portion of the planarization layer 670. As a result, the first electrode 690 may be electrically connected to the semiconductor element 650. The first electrode 690 may be formed using a metal, an alloy, metal nitride, conductive metal oxide, transparent conductive materials, etc.

A pad electrode 700 may be formed within the second region 20 on the planarization layer 670. The pad electrode 700 may be in contact with the connection line 620 through the first via hole 675. In example embodiments, the pad electrode 700 may have a stacked structure, and the stacked structure may include ITO/Ag/ITO. The pad electrode 700 and the first electrode 690 may be simultaneously formed using the same materials.

A pixel defining layer 710 may expose a portion of the first electrode 690 within the first region 10 on the planarization layer 670, and may expose a portion of the pad electrode 700 within the second region 20 on the planarization layer 670. After a process etching a preliminary first electrode layer and a preliminary pad electrode layer formed on the entire planarization layer 670, the pixel defining layer 710 may cover both lateral portions (i.e. edge portions) of the etched first electrode 690 and both lateral portions (i.e. edge portions) of the etched pad electrode 700. This is because particles are generated in both lateral portions of the etched first electrode 690 and both lateral portions of the etched pad electrode 700. The pixel defining layer 710 may be formed using organic materials or inorganic materials. In example embodiments, the pixel defining layer 710 may include organic materials.

Figure 13:
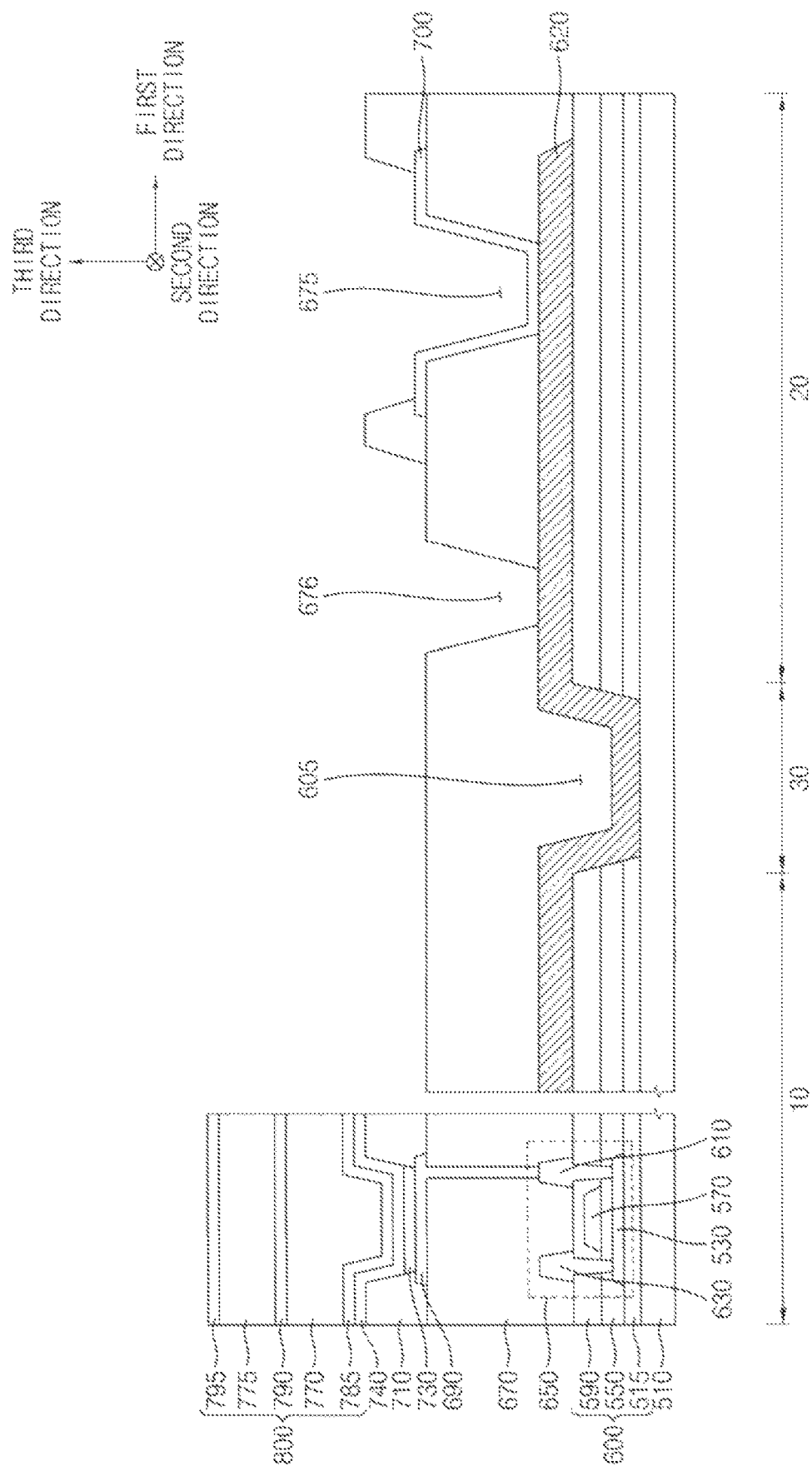
FIG. 13 is another cross-sectional view taken in another direction illustrating a method of manufacturing an OLED device where the pads, the via holes and the pixel defining layer are produced.

Referring now to FIG. 13, a light emitting layer 730 may be formed on the first electrode 690 exposed by the pixel defining layer 710. The light emitting layer 730 may have a multi-layered structure, including EL, HIL, HTL, ETL, and EIL. The EL of the light emitting layer 730 may be formed using at least one of light emitting materials capable of generating different colors of light (e.g., a red color of light, a blue color of light, and a green color of light, etc) according to sub-pixels. Alternatively, the EL of the light emitting layer 730 may generally generate a white color of light by stacking a plurality of light emitting materials capable of generating different colors of light such as a red color of light, a green color of light, a blue color of light, etc.

A second electrode 740 may be formed on the pixel defining layer 710 and the light emitting layer 730. The second electrode 740 may cover the pixel defining layer 710 and the light emitting layer 730 within the first region 10, and may extend along the first direction on the substrate 510. The second electrode 740 may be formed using a metal, a metal alloy, metal nitride, conductive metal oxide, transparent conductive materials, etc.

A thin film encapsulation structure 800 may be formed on the second electrode 740. The thin film encapsulation structure 800 may include at least one the first thin film encapsulation layer 785 and at least one the second thin film encapsulation layer 770. For example, the second thin film encapsulation layer 770 may be formed on the first thin film encapsulation layer 785. The first thin film encapsulation layer 785 and the second thin film encapsulation layer 770 may be alternately and repeatedly arranged. The first thin film encapsulation layer 785 may cover the second electrode 740, and may be formed to have a substantially uniform thickness along a profile of the second electrode 740. The first thin film encapsulation layer 785 may prevent the pixel structure from being deteriorated by the permeation of moisture water, oxygen, etc. In addition, the first thin film encapsulation layer 785 may protect the pixel structure from external impact. The first thin film encapsulation layer 785 may be formed using inorganic materials.

The second thin film encapsulation layer 770 may be formed on the first thin film encapsulation layer 785. The second thin film encapsulation layer 770 may improve the flatness of the OLED device, and may protect the pixel structure within the first region 10. The second thin film encapsulation layer 770 may be formed using organic, materials.

The first thin film encapsulation layer 790 may be formed on the second thin film encapsulation layer 770. The first thin film encapsulation, layer 790 may cover the second thin film encapsulation layer 770, and may be formed to have a substantially uniform thickness along a profile of the second thin film encapsulation layer 770. The first thin film encapsulation layer 790 together with the first thin film encapsulation layer 785 and the second thin film encapsulation layer 770 may prevent the pixel structure from being deteriorated by the permeation of moisture, water, oxygen, etc. In addition, the first thin film encapsulation layer 790 together with the first thin film encapsulation layer 785 and the second thin film encapsulation layer 770 may protect the pixel structure from external impact. The first thin film encapsulation layer 790 may be formed using inorganic materials.

The second thin film encapsulation layer 775 may be formed on the first thin film encapsulation layer 790. The second thin film encapsulation layer 775 may perform functions substantially the same as or similar to those of the second thin film encapsulation layer 770, and the second thin film encapsulation layer 775 may include a material substantially the same as or similar to that of the second thin film encapsulation layer 770. The first thin film encapsulation layer 795 may be formed on the second thin film encapsulation layer 775.

The first thin film encapsulation layer 795 may perform functions substantially the same as or similar to those of the first thin film encapsulation layers 785 and 790, and the first thin film encapsulation layer 795 may include a material substantially the same as or similar to that of the first thin film encapsulation layers 785 and 790. Accordingly, the OLED device 100 of FIGS. 4 and 5 may be manufactured.

Figure 14:
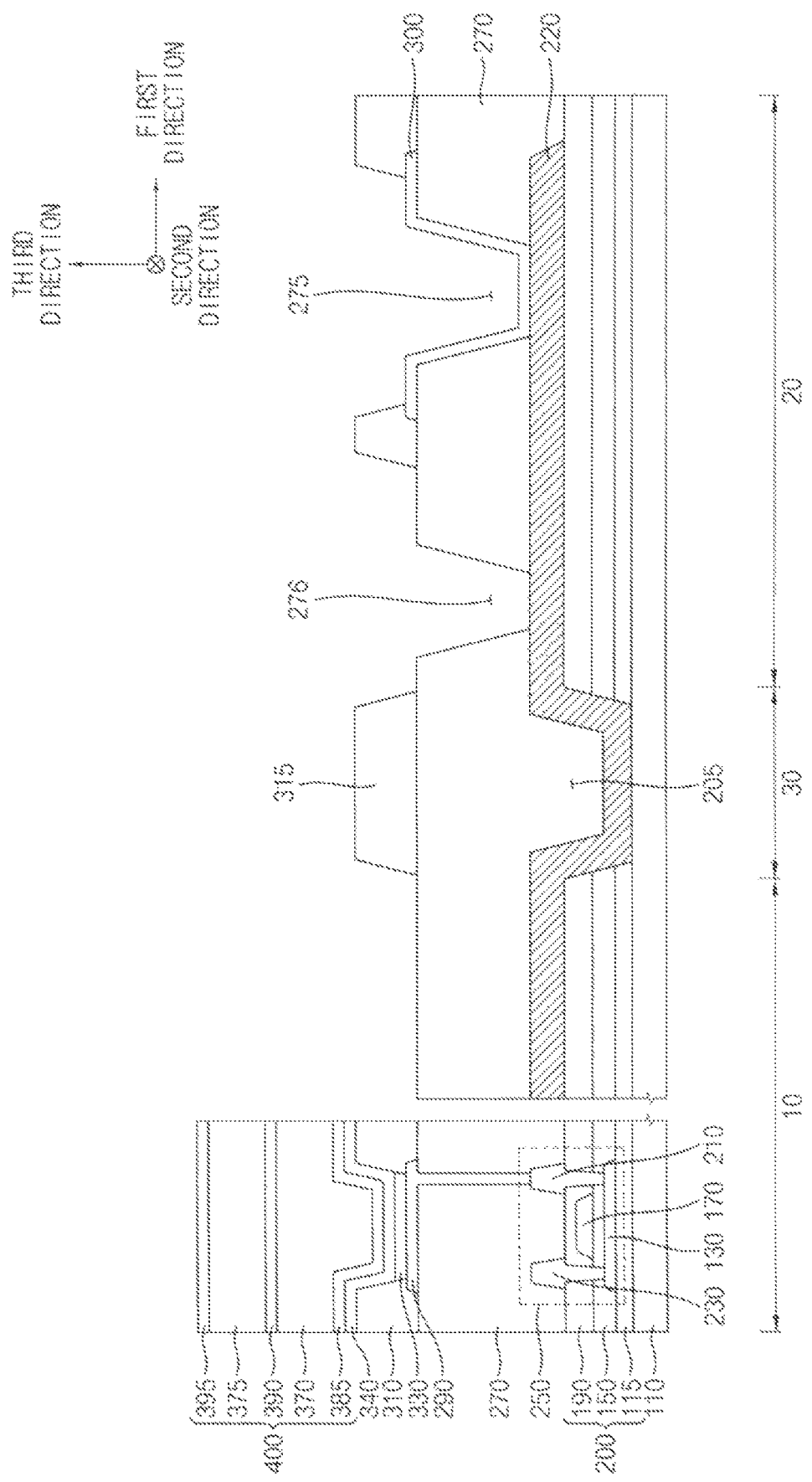
FIG. 14 is a cross-sectional view illustrating an example of the OLED device of FIG. 1.

Turning now to FIG. 14, FIG. 14 is a cross-sectional view illustrating an example of the OLED device of FIG. 1. An OLED device illustrated in FIG. 14 may have a configuration substantially the same as or similar to that of the OLED device 100 described with reference to FIGS. 4 and 5 except a protection member 315 may further be present. In FIG. 14, it will be omitted the detailed description about elements and processes substantially the same as or similar to that of the elements and the processes described with reference to FIGS. 4 and 5.

Referring now to FIG. 14, an OLED device may include a substrate 110, a pixel structure, an insulation layer 200, a thin film encapsulation structure 400, a connection line 220, a pad electrode 300, a planarization layer 270, a pixel defining layer 310, a protection member 315, etc. Here, the pixel structure may include a semiconductor element 250, a first electrode 290, a light emitting layer 330, and a second electrode 340. The semiconductor element 250 may include an active layer 130, a gate electrode 170, a source electrode 230, and a drain electrode 210. The insulation layer 200 may include a buffer layer 115, a gate insulation layer 150, and an insulating interlayer 190. The thin film encapsulation structure 400 may include first thin film encapsulation layers 385, 390, and 395 and second thin film encapsulation layers 370 and 375.

The protection member 315 may be disposed within the third region 30 on the planarization layer 270. As the protection member 315 is disposed, a neutral plane of the third region 30 of the OLED device may further two up in a third direction. Accordingly, the connection line 220 may not be easily broken or cut. The protection member 315 may include organic materials such as polyimide epoxy-based resin, acryl-based resin, polyester, photoresist, polyacryl-based resin, polyimide-based resin, a polyamide-based resin, a siloxane-based resin, etc, and may include elastic materials such as silicon, urethane, thermoplastic poly urethane (TPU), etc. The protection member 315 and the pixel defining layer 310 may be simultaneously formed using the same materials.

Figure 15:
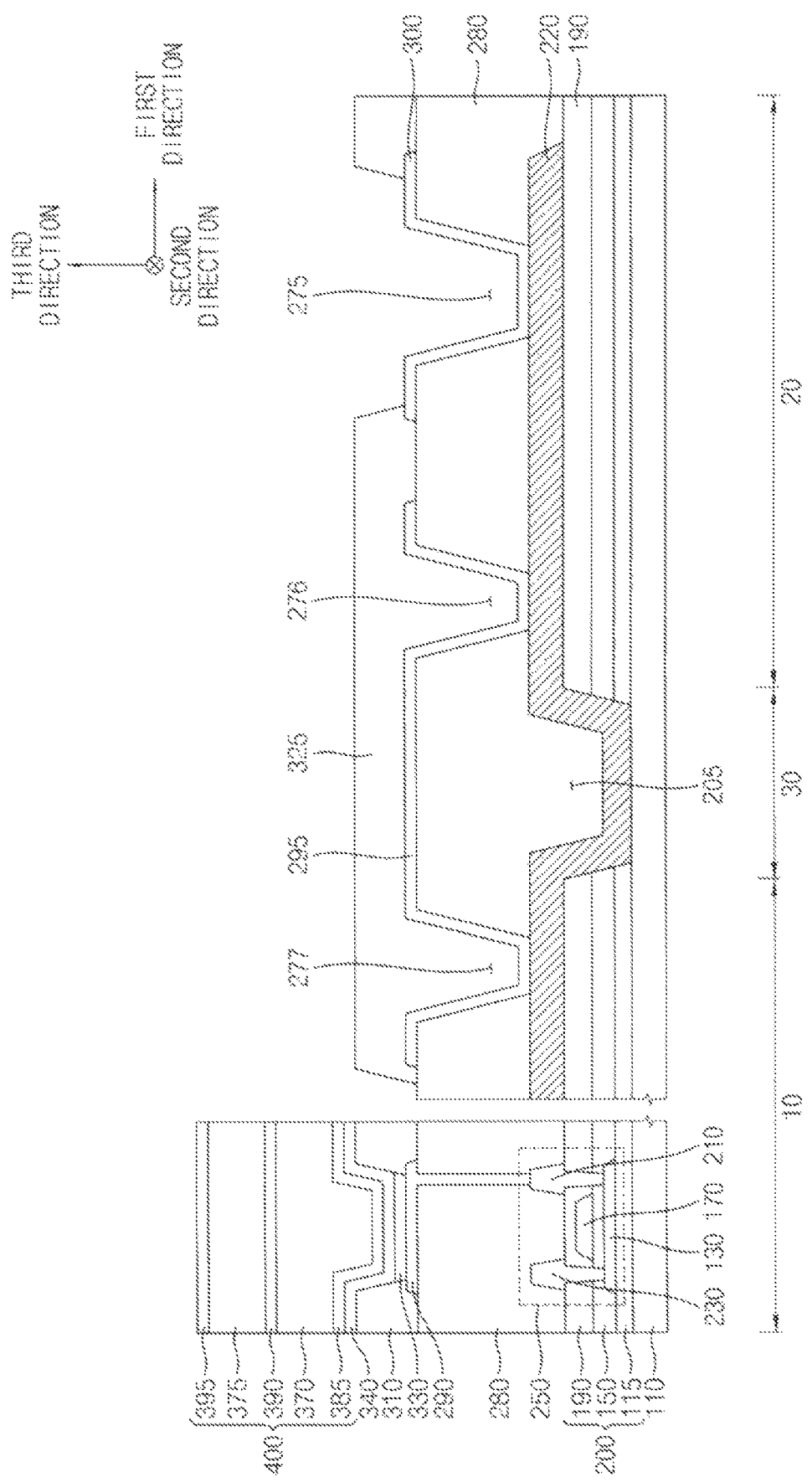
FIG. 15 is a cross-sectional view illustrating an example of the OLED device of FIG. 1.
Figure 16:
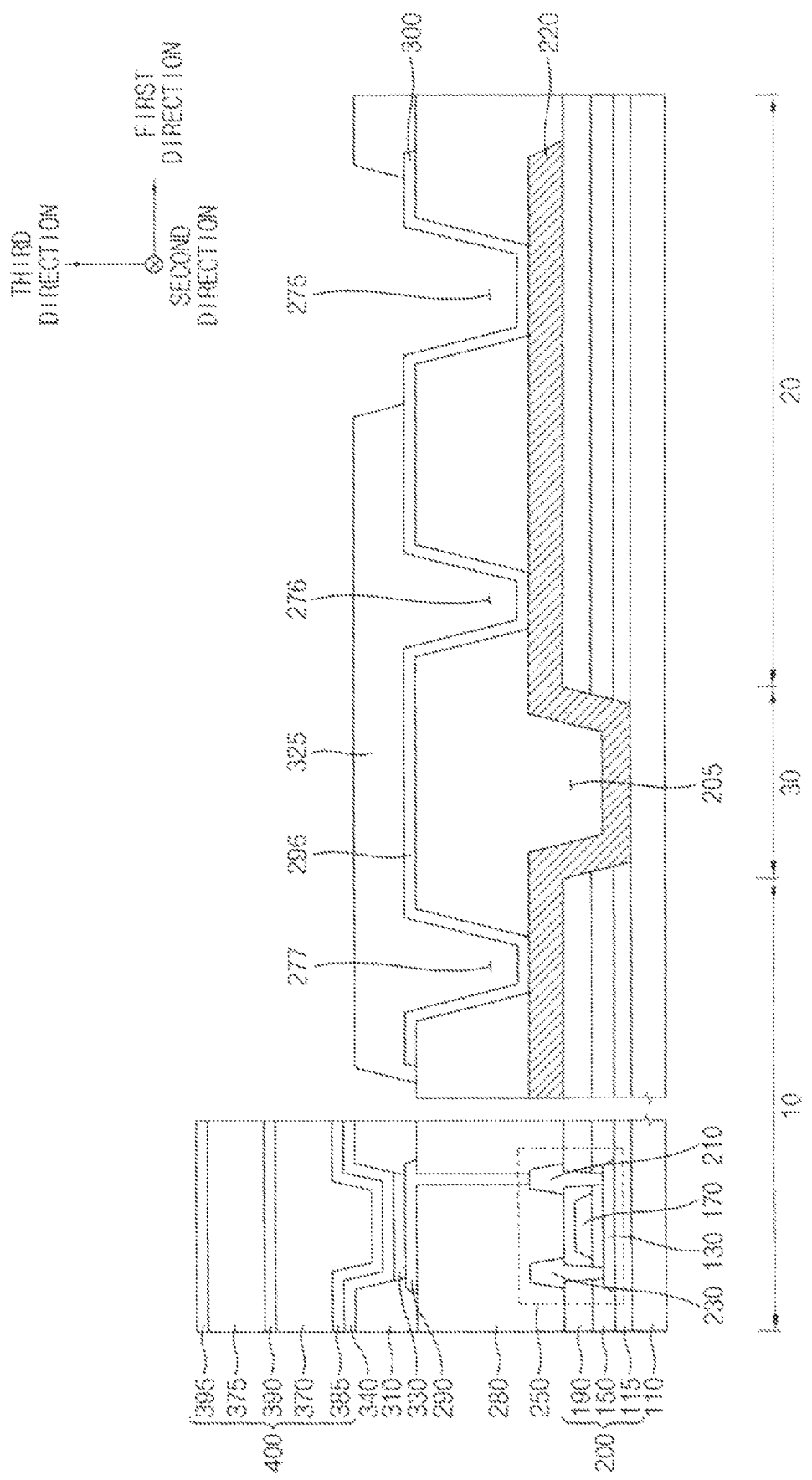
FIG. 16 is a cross-sectional view illustrating an example of the OLED device of FIG. 1.

Turning now to FIGS. 15 and 16, FIG. 15 is a cross-sectional view illustrating an example of the OLED device of FIG. 1, and FIG. 16 is another cross-sectional view illustrating another example of the OLED device of FIG. 1. The OLED devices illustrated in FIGS. 15 and 16 may have a configuration substantially the same as or similar to that of the OLED device 100 described with reference to FIGS. 4 and 5 except for a first auxiliary line 295 and 296, a protection member 325, and a planarization layer 280. In describing FIGS. 15 and 16, a detailed description about elements and processes substantially the same as or similar to that of the elements and the processes described with reference to FIGS. 4 and 5 will be omitted.

Referring now to FIG. 15, an OLED device may include a substrate 110, a pixel structure, an insulation layer 200, a thin film encapsulation structure 400, a connection line 220, a pad electrode 300, a planarization layer 280, a pixel defining layer 310, a first auxiliary line 295, a protection member 325, etc. Here, the pixel structure may include a semiconductor element 250, a first electrode 290, a light emitting layer 330, and a second electrode 340. The semiconductor element 250 may include an active layer 130, a gate electrode 170, a source electrode 230, and a drain electrode 210. The insulation layer 200 may include a buffer layer 115, a gate insulation layer 150, and an insulating interlayer 190. The thin film encapsulation structure 400 may include, a first thin film encapsulation layers 385, 390, and 395 and a second thin film encapsulation layers 370 and 375.

The planarization layer 280 may be disposed on the source electrode 230, the drain electrode 210, and the connection line 220. In example embodiments, the planarization layer 280 may have a first via hole 275 exposing the connection line 220 within the second region 20, a second via hole 276 exposing the connection line 220 at a location that is adjacent to boundary of the second region 20 and the third region 30, and a third via hole 277 exposing the connection line 220 at a location that is adjacent to boundary of the first region 10 and the third region 30. The second and third via holes 276 and 277 may block moisture or water that has permeated from the outside into the OLED device.

The first auxiliary line 295 may be disposed on the planarization layer 280. The first auxiliary line 295 may be electrically connected to the connection line 220 through the third via hole 277 within the first region 10. In this case, although the connection line 220 is broken (or cut) within the third region 30 due to a step of the insulation layer, the pixel structure and an external device may be electrically connected together through the first auxiliary line 295. In example embodiments, the first electrode 290, the first auxiliary line 295, and the pad electrode 300 may be simultaneously formed using, the same materials.

The protection member 325 may be disposed in a portion of the first region 10, a portion of the second region 20, and the third region 30 on the first auxiliary line 295. As the protection member 325 is disposed, a neutral plane of the third region 30 of the OLED device 100 may further go up in a third direction. Accordingly, the third region 30 may be readily bent.

In some example embodiments, as illustrated in FIG. 16, the first auxiliary line 296 and the pad electrode may be integrally formed.

Figure 17:
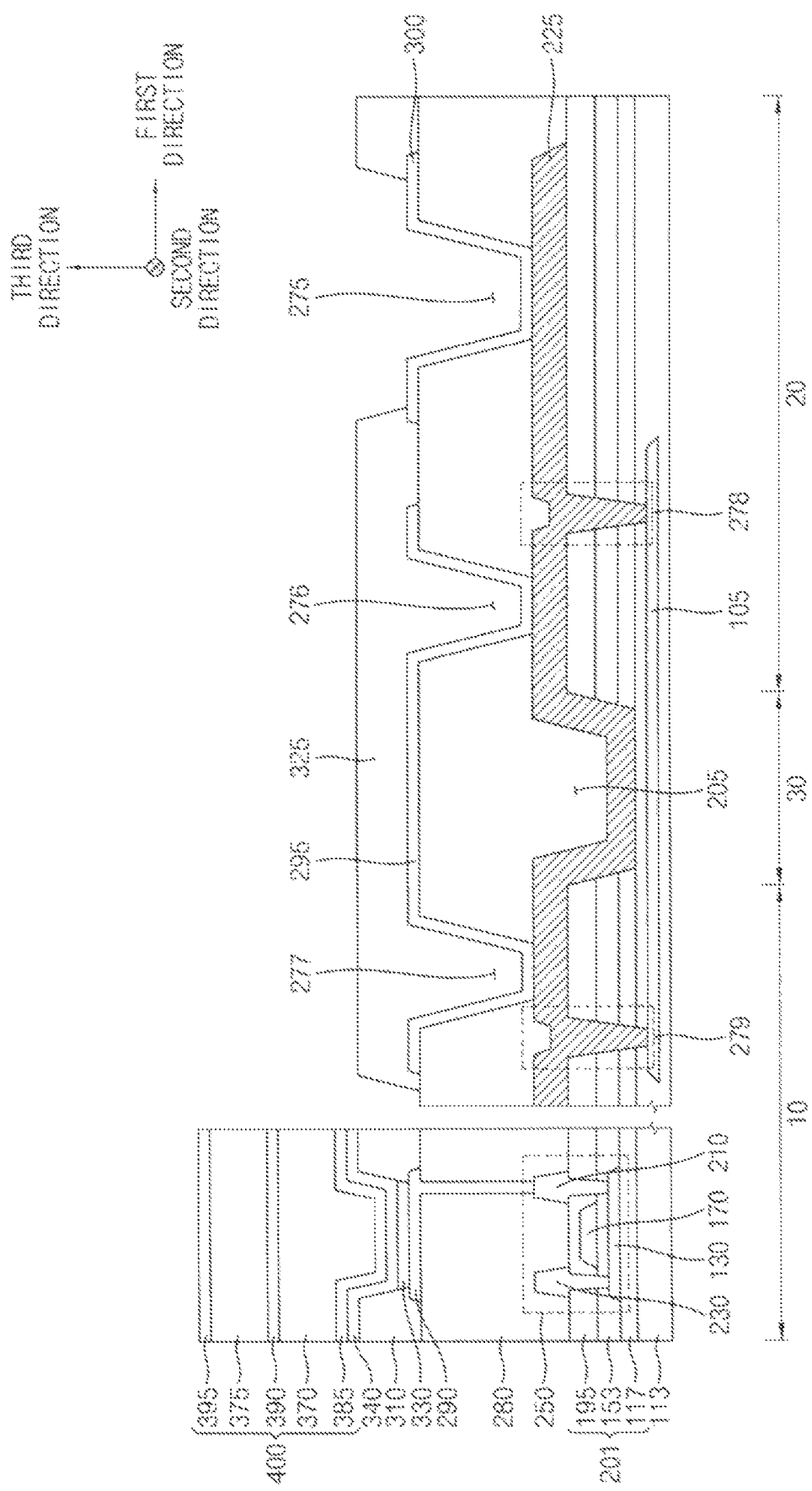
FIG. 17 is a cross-sectional view illustrating an example of the OLED device of FIG. 1.
Figure 18:
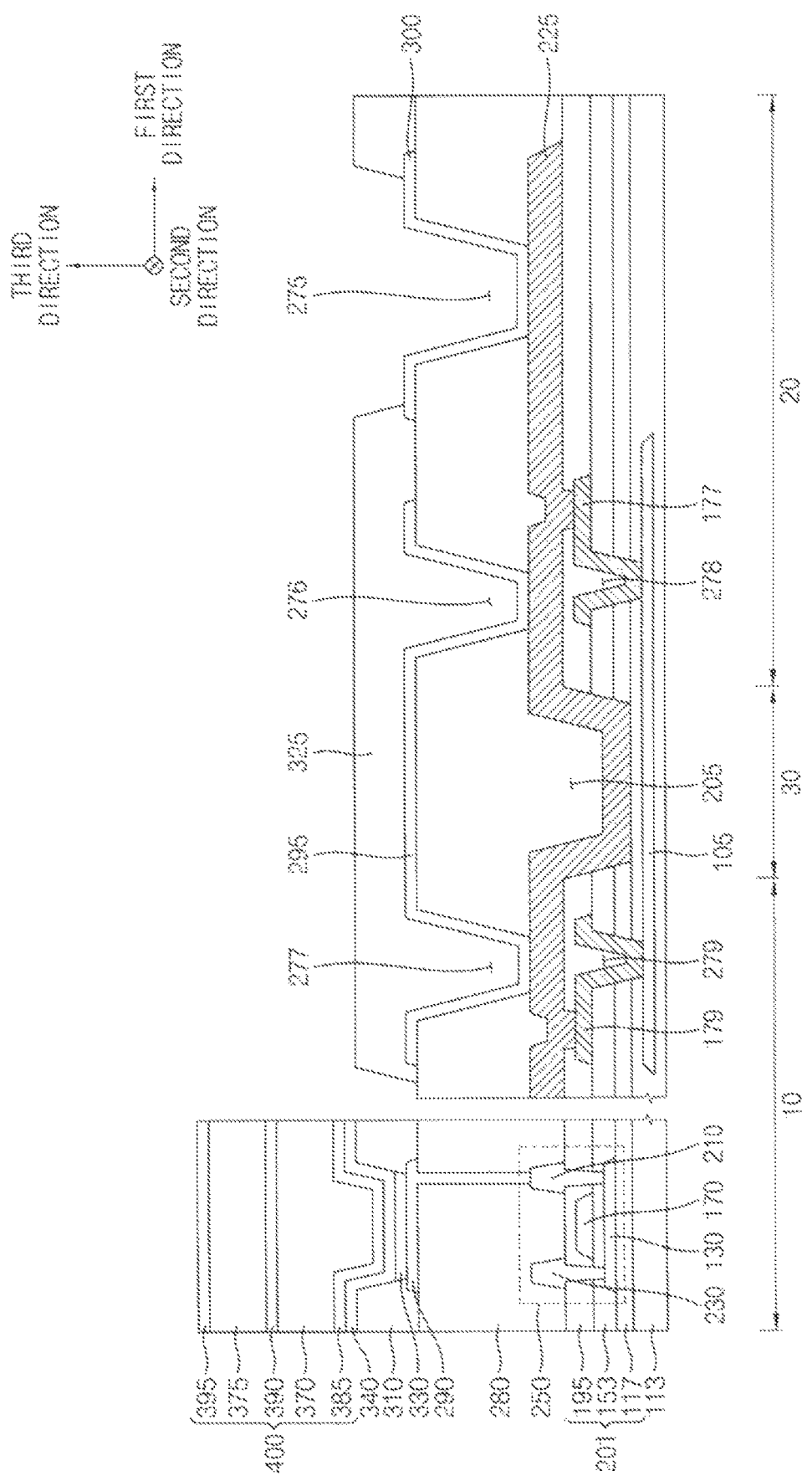
FIG. 18 is a cross-sectional view illustrating an example of the OLED device of FIG. 1.

Turning now to FIGS. 17 and 18, FIG. 17 is a cross-sectional view illustrating an example of the OLED device of FIG. 1, and FIG. 18 is another cross-sectional view illustrating another example of the OLED device of FIG. 1. An OLED device illustrated in FIGS. 17 and 18 may have a configuration substantially the same as or similar to that of the OLED device 100 described with reference to FIGS. 4 and 5 except for substrate 113, connection line 225, first auxiliary line 295, protection member 325, planarization layer 280, second auxiliary line 105, and insulation layer 201. In the following description of FIGS. 17 and 18 the detailed description about elements and processes substantially the same as or similar to that of the elements and the processes described with reference to FIGS. 4 and 5 will be omitted.

Referring now to FIG. 17, an OLED device may include a substrate 113, a pixel structure, an insulation layer 201, a thin film encapsulation structure 400, a connection line 225, a pad electrode 300, a planarization layer 280, a pixel defining layer 310, a first auxiliary line 295, a second auxiliary line 105, a protection member 325, etc. Here, the pixel structure may include a semiconductor element 250, a first electrode 290, a light emitting layer 330, and a second electrode 340. The semiconductor e me u 250 may include an active layer 130, a gate electrode 170, a source electrode 230, and a drain electrode 210. The insulation layer 201 may include a buffer layer 117, a gate insulation layer 153, and an insulating interlayer 195. The thin film encapsulation structure 400 may include a first thin film encapsulation layers 385, 390, and 395 and a second thin film encapsulation layers 370 and 375.

The substrate 113 may include a polyimide substrate. In example embodiments, the polyimide substrate may include a first polyimide layer, a first barrier film layer, a second polyimide layer, a second barrier film layer. The first and second barrier film layers may include inorganic materials. For example, the first barrier film layer may be disposed on the first polyimide layer, and the second polyimide layer may be disposed on the first barrier film layer. In addition, the second barrier film layer may be disposed on the second polyimide layer. Here, the second auxiliary line 105 may be interposed between the first polyimide layer and the first barrier film layer. In example embodiments, the second auxiliary line 105 may be embedded within the substrate 113. The second auxiliary line 105 may be located in a portion of the first region 10, the third region 30, and the second region 20. In addition, the second polyimide layer and the second barrier film layer may have each of openings exposing, the second auxiliary line 105 in each of the first and second regions 10 and 20.

The buffer layer 117 may be disposed on the substrate 113. The buffer layer 117 may have an opening exposing a portion of the second auxiliary line 105 within the first region 10 and an opening exposing a portion of the second auxiliary line 105 within the second region 20. A position of each of the openings of the buffer layer 117 may be the same as that of each of the openings of the second polyimide layer and the second barrier film layer.

The gate insulation layer 153 may be disposed on the buffer layer 117. The gate insulation layer 153 may have an opening exposing a portion of the second auxiliary line 105 within the first region 10 and an opening exposing a portion of the second auxiliary line 105 may be try within the second region 20. A position of each of the openings the gate insulation layer 153 may be the same as that of each of the openings of the second polyimide layer, the second barrier film layer, and the buffer layer 117.

The insulating interlayer 195 may be disposed on the gate insulation layer 153. The insulating interlayer 195 may have an opening exposing a portion of the second auxiliary line 105 within the first region 10 and an opening exposing a portion of the second auxiliary line 105 within the second region 20. A position of each of the openings of the insulating interlayer 195 may be the same as that of each of the openings of the second polyimide layer, the second barrier film layer, the buffer layer 117, and the gate insulation layer 153. Accordingly, the insulation layer 201 may have a fourth via, hole 278 exposing the second auxiliary line 105 by removing, a portion of the substrate 113, a portion of the buffer layer 117, a portion of the gate insulation layer 153, and a portion of the insulating interlayer 195 within the second region 20 and a fifth via hole 279 exposing the second auxiliary line 105 by removing a portion of the substrate 113, a portion of the buffer layer 117, a portion of the gate insulation layer 153, and a portion of the insulating interlayer 195 within the first region 10.

The connections line 225 may be disposed within the first region 10 and the second 22 region 20 on the insulating interlayer 195. The Connection lines 225 may be disposed on side walls of the opening 205 that are located within the first direction within the thud region 30. The connection lines 225 are also arranged on portions of the substrate 113 exposed by the opening 205 within the third region 30. The connection lines 225 may be in contact with the second auxiliary line 105 through the fourth via hole 278 within the second region 20, and may be in contact with the second auxiliary line 105 through the fifth via hole 279 within the first region 10.

The planarization layer 280 may be disposed on the source electrode 230, the drain electrode 210, and the connection line 225. In example embodiments, the planarization layer 280 may have a first via hole 275 exposing the connection line 225 within the second region 20, a second via hole 276 exposing the connection line 225 at a location that is adjacent to boundary of the second region 20 and the third region 30, and a third via hole 277 exposing the connection line 225 at a location that is adjacent to boundary of the first region 10 and the third region 30.

The first auxiliary line 295 may be disposed on the planarization layer 280. The first auxiliary line 295 may be electrically connected to the connection line 245 through the third is hole 277 within the first region 10, and may be electrically connected to the connection line 225 through the second via hole 276 within the second region 20.

The protection member 325 may be disposed in a portion of the first region 10, a portion of the second region 20, and the third region 30 on the first auxiliary line 295. When the protection member 325 is included, a neutral plane of the third region 30 of the OLED device may further go up in a third direction.

Accordingly, although the connection line 225 is broken (or cut) within the third region 30, the pixel structure and an external device may be electrically connected through the first auxiliary line 295 and the second auxiliary line 105. In example embodiments, the first electrode 290, the first auxiliary line 295, and the pad electrode 300 may be simultaneously formed using the same materials.

In some example embodiments, as illustrated in FIG. 18, a third auxiliary line 177 may be disposed within the second region 20 on the gate insulation layer 153, and a fourth auxiliary line 179 may be disposed within the first region 10 on the gate insulation layer 153. The third auxiliary line 177 may be electrically connected to the second auxiliary line 105 and the connection line 225 through the fourth via hole 278, and the fourth auxiliary line 179 may be electrically connected to the second auxiliary line 105 and the connection line 225 through fifth via hole 279. In this case, the third auxiliary line 177 and the fourth auxiliary line 179 may be simultaneously formed using the same materials.

Figure 19:
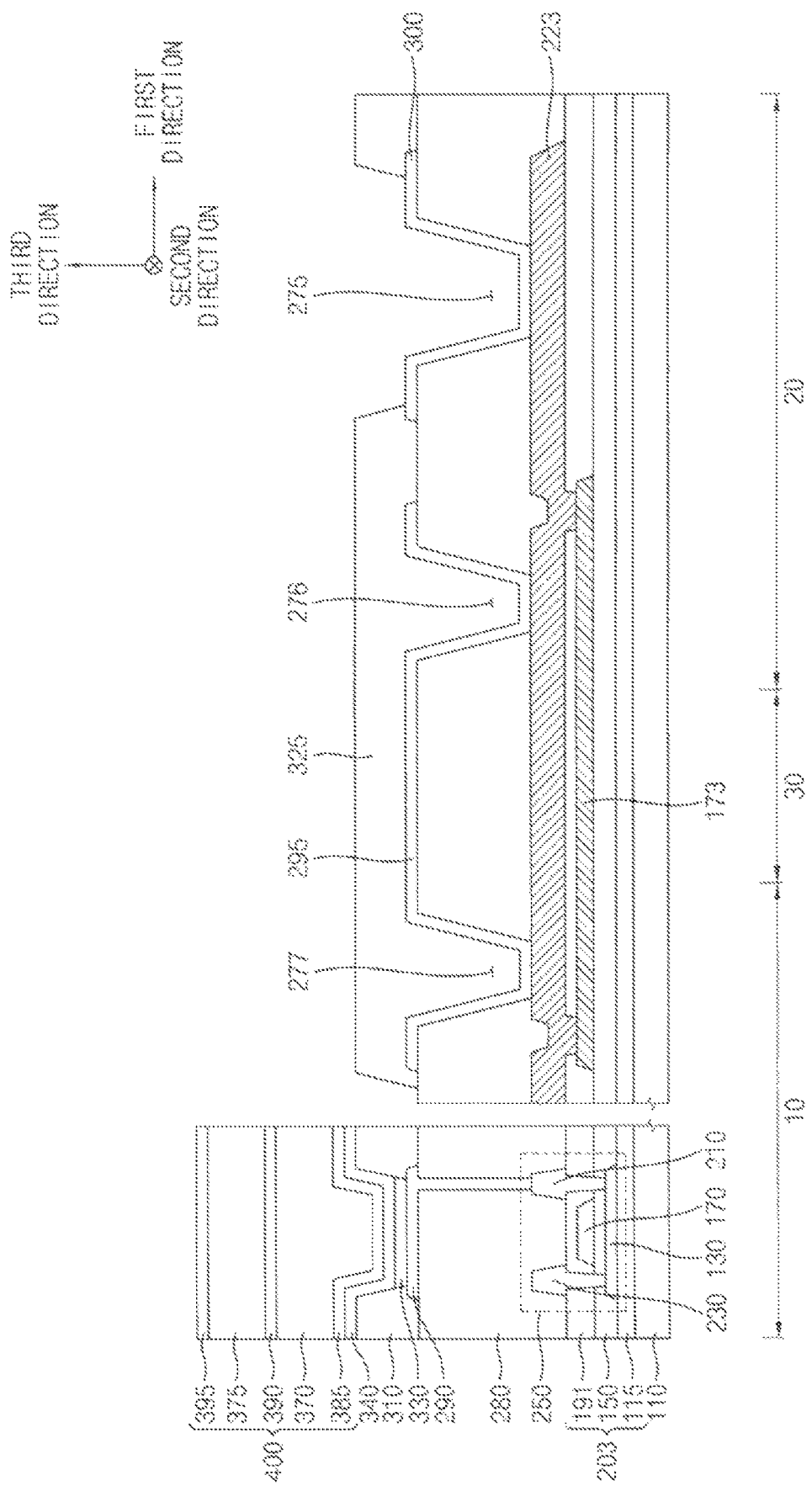
FIG. 19 is a cross-sectional view illustrating an example of the OLED device of FIG. 1.

Turning now to FIG. 19, FIG. 19 is a cross-sectional view illustrating another example of the OLED device of FIG. 1. An OLED device illustrated in FIG. 19 may have a configuration substantially the same as or similar to that of the OLED device 100 described with reference to FIGS. 4 and 5 except a connection line 223, a first auxiliary line 295, a protection member 325, a planarization layer 280, a fifth auxiliary line 173, and an insulation layer 203. In the description of FIG. 19 that follows, a detailed description about elements and processes substantially the same as or similar to that of the elements and the processes described with reference to FIGS. 4 and 5 will be omitted.

Referring now to FIG. 19, an OLED device may include a substrate 110, a pixel structure, an insulation layer 203, a thin film encapsulation structure 400, a connection line 223, a pad electrode 300, a planarization layer 280, a pixel defining layer 310, a first auxiliary line 295, a fifth auxiliary line 173, a protection member 325, etc. Here, the pixel structure may include a semiconductor element 250, a first electrode 290, a light emitting layer 330, and a second electrode 340. The semiconductor element 250 may include an active layer 130, a gate electrode 170, a source electrode 230, and a drain electrode 210. The insulation layer 203 may include a buffer layer 115, a gate insulation layer 150, and an insulating interlayer 191. The thin film encapsulation structure 400 may include a first thin film encapsulation layers 385, 390, and 395 and a second thin film encapsulation layers 370 and 375.

The fifth auxiliary line 173 may be disposed on the gate insulation layer 150. The fifth auxiliary line 173 and the gate electrode 170 may be simultaneously formed using the same materials.

The insulating interlayer 191 may be disposed on the gate insulation layer 150. The insulating interlayer 191 may have an opening exposing a portion of the fifth auxiliary line 173 within the first region 10 and an opening exposing a portion of the fifth auxiliary line 173 within the second region 20.

The connection line 223 may be disposed within the first region 10, the second region 20, and the third region 30 and on the insulating interlayer 191. The connection line 223 may be in contact with the fifth auxiliary line 173 through each of openings of the insulating interlayer 191 within the first region 10 and the second region 20.

The planarization layer 280 may be disposed on the source electrode 230, the drain electrode 210, and the connection line 223. In the example embodiment of FIG. 19, the planarization layer 260 may have a first via hole 275 exposing the connection line 223 within the second region 20, a second via hole 276 exposing the connection line 223 at a location that is adjacent to boundary of the second region 20 and the third region 30, and a third via hole 277 exposing the connection line 223 at a location that is adjacent to boundary of the first region 10 and the third region 30.

The first auxiliary line 295 may be disposed on the planarization layer 280. The first auxiliary line 295 may be electrically connected to the connection line 223 through the third via hole 277 within the first region 10, and may be electrically connected to the connection line 223 through the second via hole 276 within the second region 20. The protection member 325 may be disposed in a portion of the first region 10, a portion of the second region 20, and the third region 30 on the first auxiliary line 295.

Figure 20:
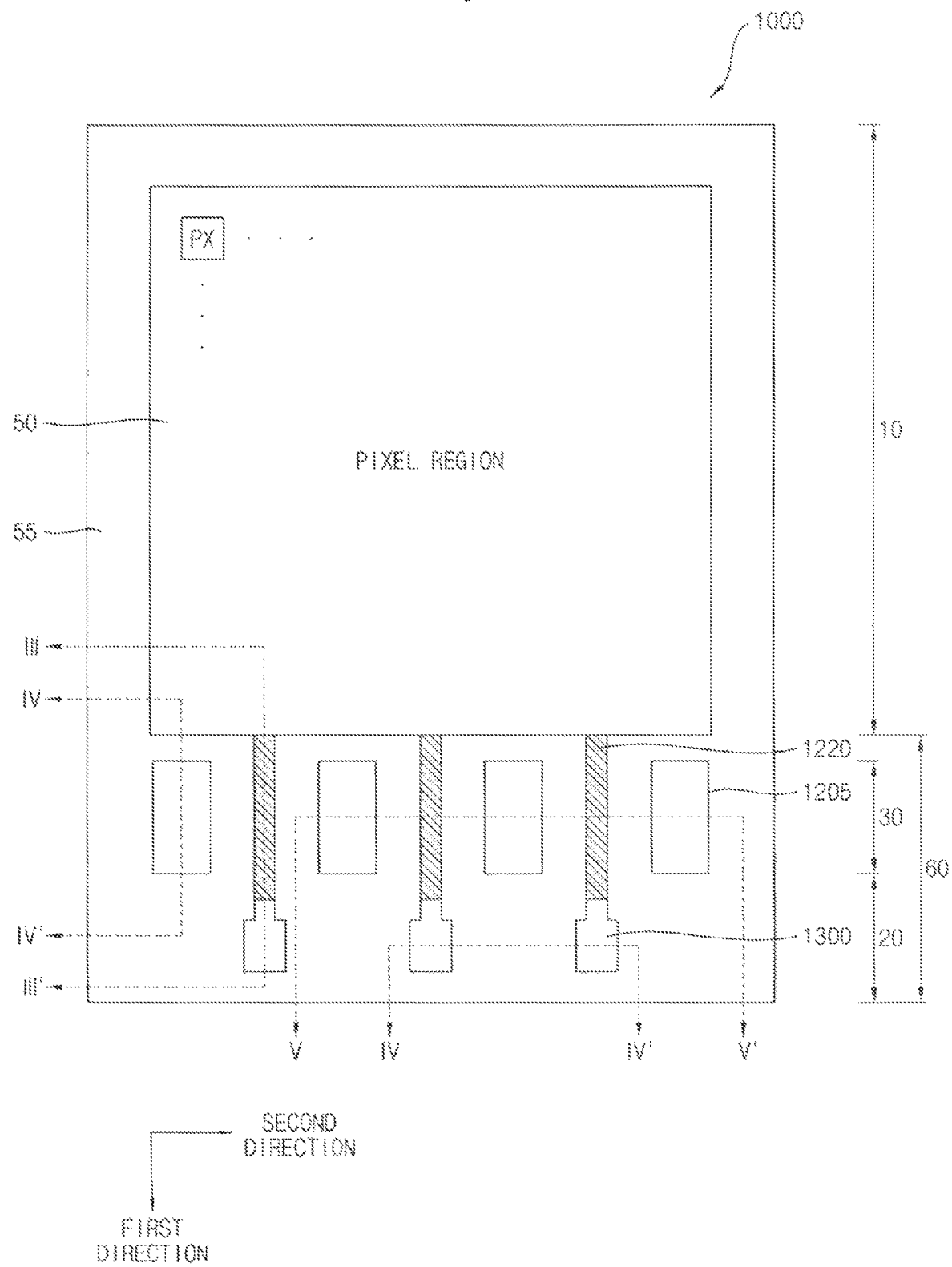
FIG. 20 is a planar view illustrating an OLED device in accordance with example embodiments.
Figure 21:
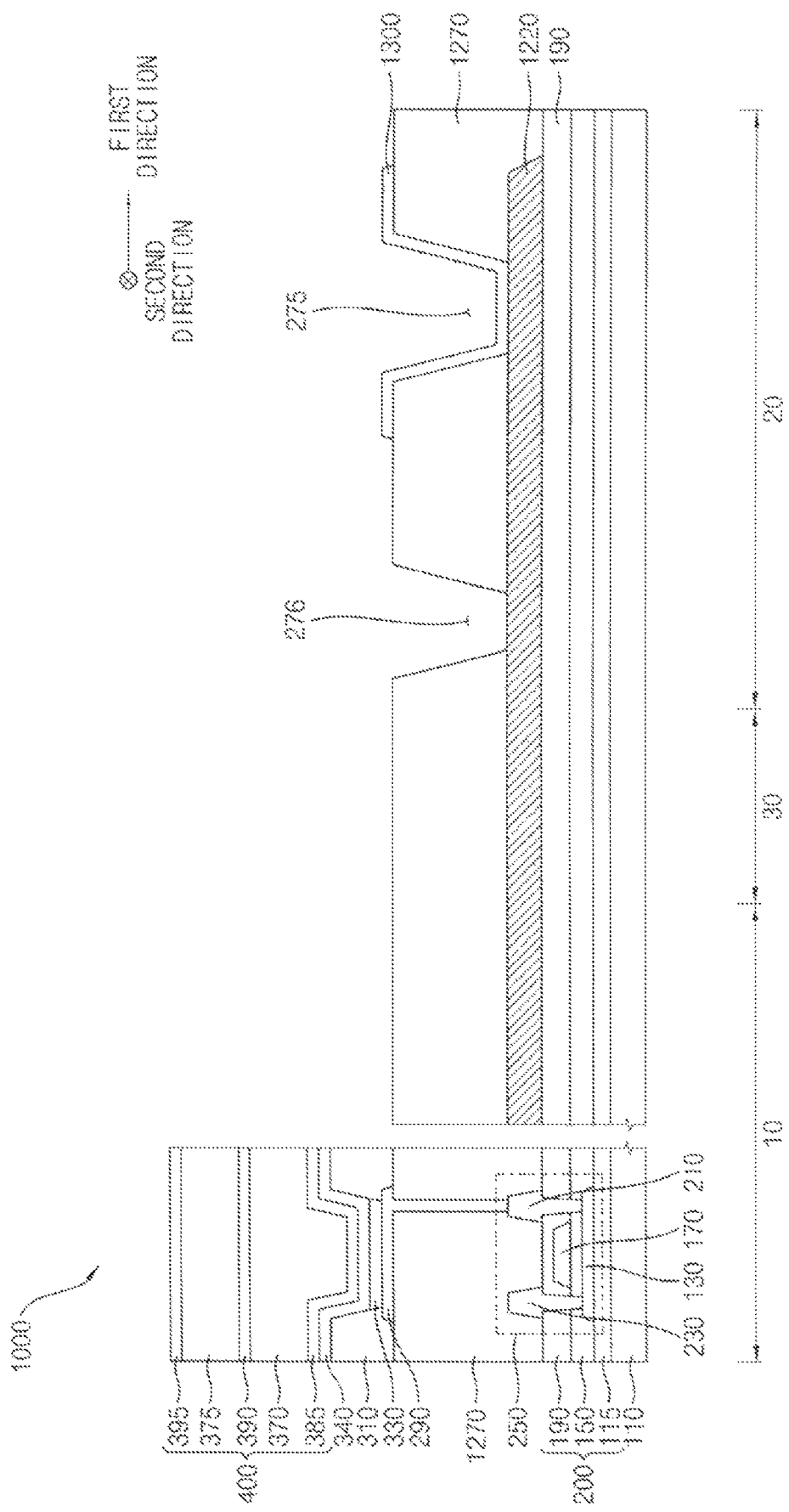
FIG. 21 is a cross-sectional view taken along a line III-III' of FIG. 20.
Figure 22:
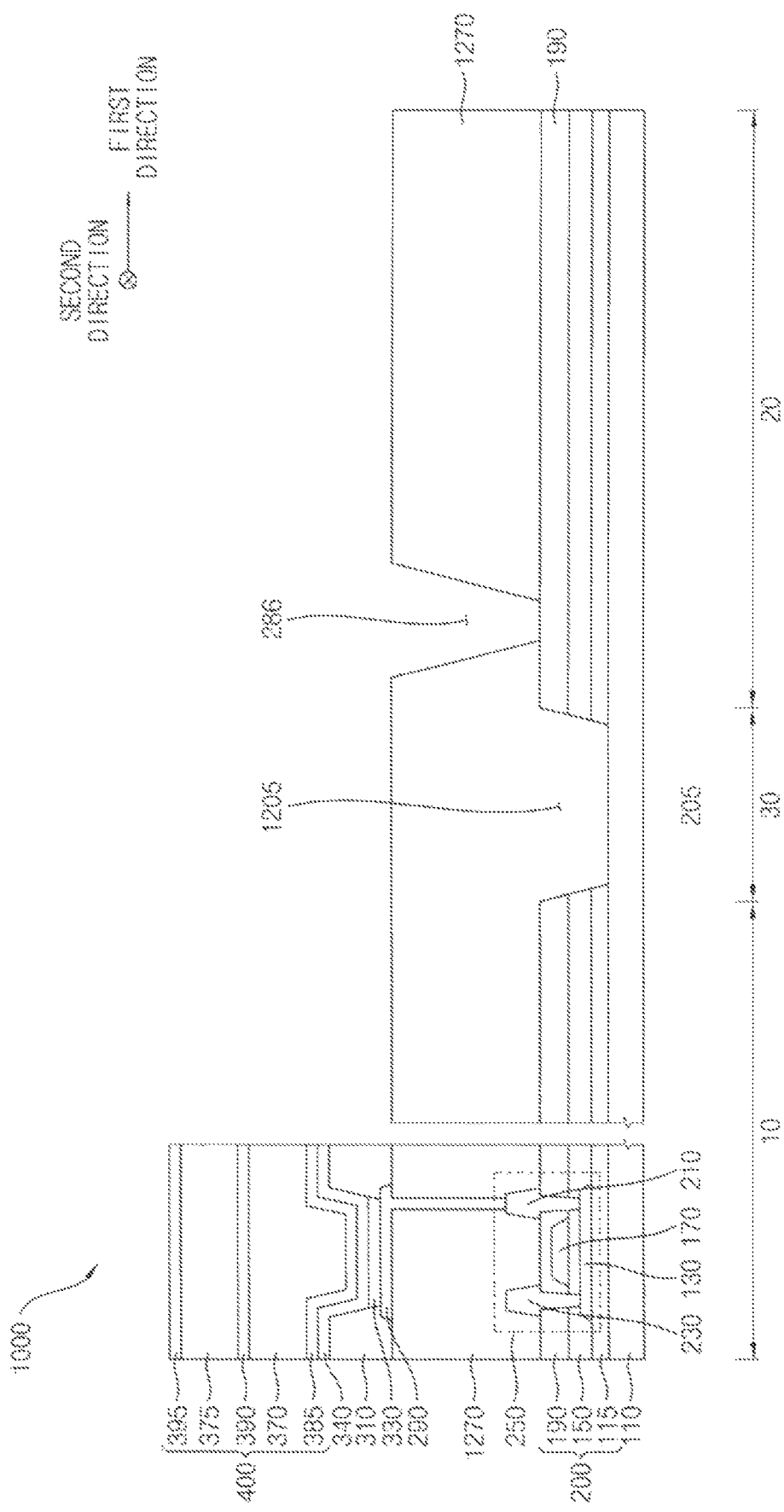
FIG. 22 is a cross-sectional view taken along a line IV-IV' of FIG. 20.
Figure 23:
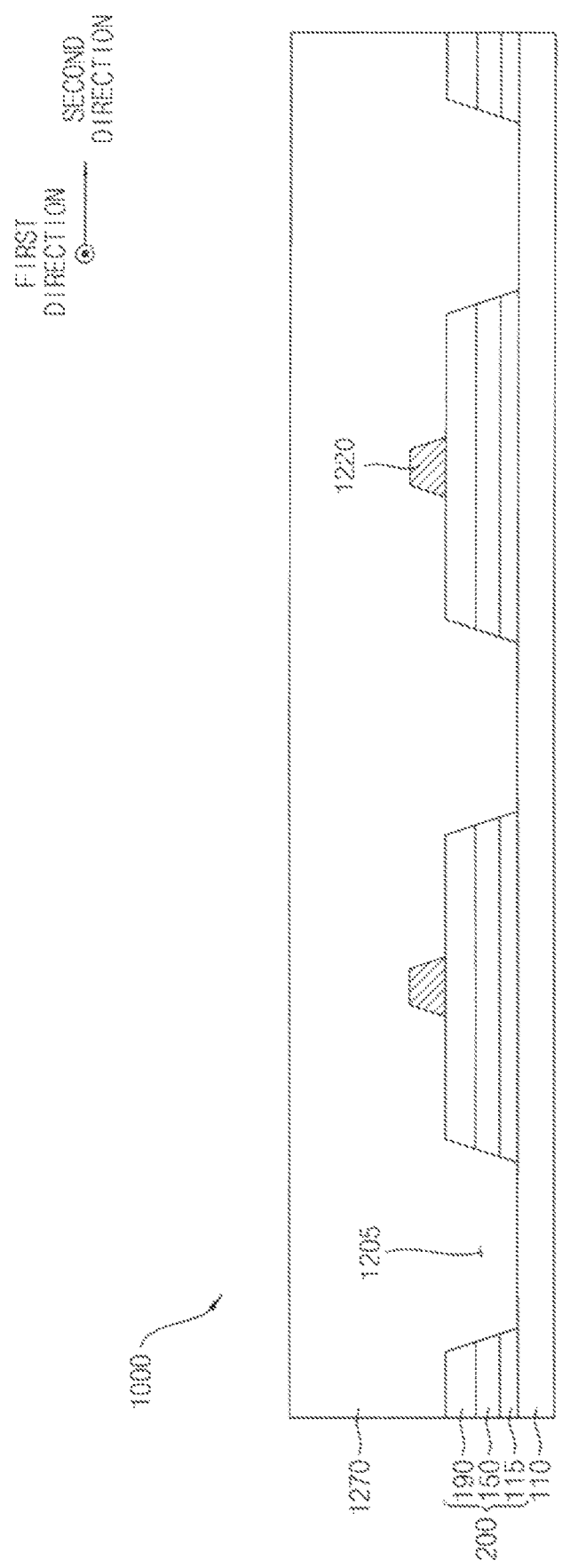
FIG. 23 is a cross-sectional view taken along a line V-V' of FIG. 20.
Figure 24:
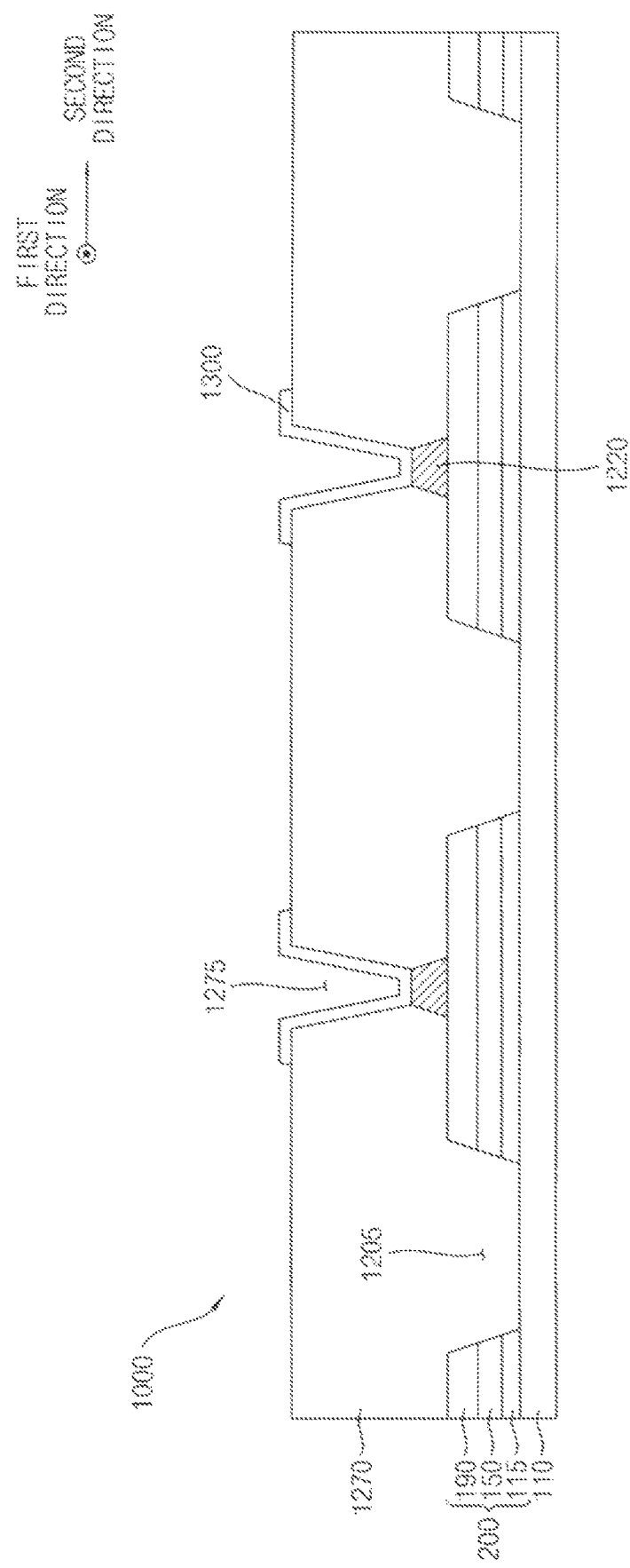
FIG. 24 is a cross-sectional view taken along a line VI-VI' of FIG. 20.

Turning now to FIGS. 20 to 24, FIG. 20 is a planar view illustrating an OLED device in accordance with example embodiments, and FIG. 21 is a cross-sectional view taken along a line III-III' of FIG. 20, FIG. 22 is a cross-sectional view taken along a line IV-IV' of FIG. 20, and FIG. 23 is a cross-sectional view taken along a line V-V' of FIG. 20 and FIG. 24 is a cross sectional view taken along line VI-VI' of FIG. 20. An OLED device 1000 illustrated in FIGS. 20 through 24 may have a configuration substantially the same as or similar to that of the OLED device 100 described with reference to FIGS. 1 through 5, except for a connection line 1220, a pad electrode 1300, and an opening 1205. In FIGS. 20 through 24, a detailed description about elements and processes substantially the same as or similar to that of the elements and the processes described with reference to FIGS. 1 through 5 will be omitted.

Referring now to FIG. 20, an OLED device 1000 may include a pixel region 50 and a peripheral region 55. Here, the peripheral region 55 may surround the pixel region 50. In addition, the peripheral region 55 may include a pad region 60 including a bend region 30 e.g., a third region that will be described below). When the bend region 30 is bent, a portion of the pad region 60 may be located on a lower surface of the OLED device 1000, and the peripheral region 55 of the OLED device 1000 may be relatively reduced.

A plurality of pixels PX (e.g., pixel structures that will be described below) may be disposed within the pixel region 50, and the pixels PX may display an image. Common lines (e.g., data signal lines, scan signal lines, emission signal lines, power supply voltage lines, etc) may be disposed within the peripheral region 55, and an insulation layer 200 that will be described below, connection lines 1220, pad electrodes 1300, etc included within the OLED device 1000 may be disposed within the pad region 60. In addition, openings 1205 may be located within the bend region 30. For example, each of the connection lines 1220 may extend along a first direction that is parallel to an upper surface of a substrate that will be described below included within the OLED device 1000, and the openings 1205 that expose the substrate by removing the insulation layer may also extend in the first direction while being spaced-apart from one another in the second direction that is perpendicular to the first direction.

In example embodiments, the openings 1205 may include first through (N)th openings, where N is an integer greater than 1, and the connection lines 1220 may include first through (M)th connection lines, where M is an integer greater than 1. The insulation layer may be) spatially separated by the openings 1205 within the bend region 30. A (L)th connection line among the first through (M)th connection lines may be interposed between (K)th and (K+1)th openings among the first through (N)th openings on the insulation layer, where K is an integer) between 1 and N, and L is an integer between 1 and M.

The connection line 1220 may electrically connect the pixels PX disposed within the pixel region 50 to an external device. For example, the external device may be connected to the OLED device 1000 through a FPCB. The external device may provide data signals, scan signals, emission signals, power supply voltage, etc to the OLED device 1000. In addition, a driving integrated circuit may be mounted (e.g., installed) within the FPCB.

As the openings 1205 are formed, a step of the insulation layer (e.g. difference of levels) at the edge of each opening 1205 and within the bend region 30 may be increased. As the step is increased within the bend region 30, the connection lines 1220 may not be completely etched for patterned) when extended across the openings 1205 after a process of etching a preliminary connection line layer formed on the entire substrate. That is, an etching residue of the connection line 1220 may remain within the openings 1205. However, in example embodiments of FIGS. 20 to 24, none of the connection lines 1220 intersect an opening 1205, and instead an entirety of each of the connection lines 1220 is disposed on the insulation layer. In this ease, although the etching residue remain within the opening 1205, the etching residue and the connection lines 1220 may not contact each other.

Accordingly, although the insulation layer 200 of the bend region 30 is removed to produce openings 1205 to allow for bending or folding of the bend region 30, the OLED device 1000 may serve as a flexible OLED device without shorting together of the connection lines 1220.

In FIG. 20, the OLED device 1000 includes three connection lines 1220 and four openings 1205 within the pad region 60, but is not limited thereto. In some example embodiments, for example, the OLED device 1000 may include a plurality of connection lines 1220 and a plurality of openings 1205.

In addition, a planar view shape of the openings 1205 of FIG. 20 is substantially a rectangle, but is not limited thereto. For example, a planar view shape of the openings 1205 may instead have substantially a triangular shape, a substantially diamond shape, a substantially polygonal shape, a substantially circular shape, a substantially track shape, or a substantially elliptical shape.

Referring now to FIGS. 21 through 24, the OLED device 1000 may include a substrate 110, a pixel structure, an insulation layer 200, a thin film encapsulation structure 400, a connection line 1220, a pad electrode 1300, a planarization layer 1270, a pixel defining layer 310, etc. Here, the pixel structure may include a semiconductor element 250, a first electrode 290, a light emitting layer 330, and a second electrode 340. The semiconductor element 250 may include an active layer 130, a gate electrode 170, a source electrode 230, and a drain electrode 210. The insulation layer 200 may include a buffer layer 115, a gate insulation layer 150, and an insulating interlayer 190. The thin film encapsulation structure 400 may include a first thin film encapsulation layers 385, 390, and 395 and a second thin film encapsulation layers 370 and 375.

The connection lines 1220 may be disposed in at least a portion of a pixel region 50 of FIG. 20, and may extend along the first direction on the insulating interlayer 190. As the connection lines 1220 are disposed in at least a portion of the pixel region 50, the connection lines 1220 may be electrically connected to the pixel, structure. Thus, the connection lines 1220 may electrically connect the pixel structure disposed within the pixel region 50 to the external device.

The connection lines 1220 may be disposed within the first region 10, the second region 20, and the third region 30

(e.g., bend region) on the insulating interlayer 190, as illustrated in FIG. 21, and may be located between adjacent two openings 1205 among the openings 1205 within the third region 30 while being spaced-apart from each of the openings 1205 as in FIGS. 20, 23 and 24. In the embodiment of FIG. 4, a step of the connection line 220 (or the insulation layer 200) may be increased within the third region 30. As the step is increased within the third region 30, the connection line 220 may not be completely etched (e.g., patterned) within the opening 205 after a process etching, a preliminary connection line layer formed on the entire substrate 110. That is, an etching residue of the connection lines 1220 may remain within the opening 205. However, in the example embodiment of FIGS. 20 to 24, each of the connection lines 1220 is disposed on the insulation layer 200 and is spaced-apart from each opening 1205. In this case, although the etching residue remains within the opening 1205 the etching residue and the connection lines 1220 may not contact each other. Each of the connection lines 1220 may include a metal, an alloy, metal nitride, conductive metal oxide, transparent conductive materials, etc. In example embodiments, the connection lines 1220 may have a stacked structure, and the stacked structure may be formed of Ti/Al/Ti. The connection lines 1220, the source electrodes 230, and the drain electrodes 210 may be simultaneously formed using the same materials.

The planarization layer 1270 may be disposed on the source electrode 230, the drain electrode 210, and the connection lines 1220. The planarization layer 1270 may cover the source electrodes 230, the drain electrodes 210, and the connection lines 1220 within the first region 10, and may extend along the first direction on the insulating interlayer 190. That is, the planarization layer 1270 may be disposed within the first region 10, the second region 20, and the third region 30 on the entire insulating interlayer 190. In example embodiments, as illustrated in FIG. 24, the planarization layer 1270 may have a first via hole 1275 exposing the connection line 1220 within the second region 20 and a second via hole 286 (FIG. 22) at a location that is adjacent to boundary of the second region 20 and the third region 30. The second via hole 286 may block moisture or water that has permeated from the outside and into the OLED device 1000.

Referring again to FIG. 24, the pad electrodes 1300 may be disposed within the second region 20 on the planarization layer 1270. The pad electrodes 1300 may be in contact with the connection lines 1220 through the first via holes 1275. As described above, the pixel structure and the external device may be electrically connected together by the connection lines 1220 by contacting the FPCB to the pad electrode 1300. In example embodiments, the pad electrode 1300 may have a stacked structure, such as ITO/Ag/ITO. The pad electrode 1300 and the first electrode 290 may be simultaneously formed using the same materials.

The OLED device 1000 in accordance with example embodiments includes the openings 1205 within the third region 30, and each of the connection lines 1220 may be disposed on the insulation layer 200 and be spaced-apart from each of the openings 1205 within the insulation layer 200. Accordingly, although the insulation layer 200 of the third region 30 is removed to allow for bending or folding of the third region 30, the OLED device 1000 may serve as a flexible OLED device without short together of the neighboring connection lines 1220.

The present invention may be applied to various display devices including a display device. For example, the present invention may be applied to vehicle-display device, a ship-display device, an aircraft-display device, portable communication devices, display devices for display or for information transfer, a medical-display device, etc.

The foregoing is illustrative of example embodiments and is not to be construed as limiting thereof. Although a few example embodiments have been described, those skilled within the art will readily appreciate that many modifications are possible within the example embodiments without materially departing from the novel teachings and advantages of the present inventive concept. Accordingly, all such modifications are intended to be included within the scope of the present inventive concept as defined within the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. An organic light emitting display (OLED) device, comprising:
   a substrate including a first region spaced apart from a second region by a third region;
   a plurality of pixel structures arranged within the first region on the substrate;
   an insulation layer arranged within the first through third regions, the insulation layer having a plurality of openings within the third region, each opening extends in a first direction and is spaced-apart from one another in a second direction, the first and second directions being parallel to the substrate and the second direction being perpendicular to the first direction; and
   a plurality of connection lines extending in the first direction on the substrate within the first, second and third regions, wherein portions of the connection lines within the first and the second regions are arranged on the insulation layer, wherein portions of the connection lines within the third region are spaced-apart from the openings and are interposed between two adjacent openings, the connection lines electrically connecting the pixel structures to an external device,
   wherein a bottom surface of each of the connection lines is in direct contact with an upper surface of the insulation layer along an entire length of the connection line in the first direction.

2. The OLED device of claim 1, wherein the openings within the insulation layer include first through (N)th openings, where N is an integer greater than 1, and the connection lines include first through (M)th connection lines, where M is an integer greater than 1,
   wherein the insulation layer within the third region is spatially separated by the openings, and
   wherein a (L)th connection line among the first through (M)th connection lines is interposed between (K)th and (K+1)th openings among the first through (N)th openings on the insulation layer, where K is an integer between 1 and N, and L is an integer between 1 and M.

3. The display device of claim 2, further comprising:
   a planarization layer arranged on the connection lines, the planarization layer including a first via hole within the second region that exposes one of the connection lines; and a pad electrode arranged within the second region, the pad electrode being in contact with the connection line through the first via hole of the planarization layer.

* * * * *